(12) United States Patent
Lin et al.

(10) Patent No.: US 7,729,539 B2
(45) Date of Patent: Jun. 1, 2010

(54) FAST ERROR-CORRECTING OF EMBEDDED INTERACTION CODES

(75) Inventors: Zhouchen Lin, Beijing (CN); Qiang Wang, Beijing (CN); Jian Wang, Beijing (CN)

(73) Assignee: Microsoft Corporation, Redmond, WA (US)

( * ) Notice: Subject to any disclaimer, the term of this patent is extended or adjusted under 35 U.S.C. 154(b) by 1401 days.

(21) Appl. No.: 11/142,844

(22) Filed: May 31, 2005

(65) Prior Publication Data

US 2009/0027241 A1    Jan. 29, 2009

(51) Int. Cl.
*G06K 9/00* (2006.01)
*G06T 7/00* (2006.01)

(52) U.S. Cl. .................. 382/181; 382/291; 714/758; 715/232; 715/233

(58) Field of Classification Search .......... 382/181, 382/291; 714/781, 755, 758; 715/230, 232, 715/233
See application file for complete search history.

(56) References Cited

U.S. PATENT DOCUMENTS

| | | |
|---|---|---|
| 4,686,329 A | 8/1987 | Joyce |
| 4,742,558 A | 5/1988 | Ishibashi et al. |
| 4,745,269 A | 5/1988 | Van Gils et al. |
| 4,829,583 A | 5/1989 | Monroe et al. |
| 4,941,124 A | 7/1990 | Skinner, Jr. |
| 5,032,924 A | 7/1991 | Brown et al. |
| 5,051,736 A | 9/1991 | Bennett et al. |
| 5,073,966 A | 12/1991 | Sato et al. |
| 5,146,552 A | 9/1992 | Cassorla et al. |
| 5,153,928 A | 10/1992 | Iizuka |
| 5,181,257 A | 1/1993 | Steiner et al. |
| 5,196,875 A | 3/1993 | Stuckler |
| 5,235,654 A | 8/1993 | Anderson et al. |
| 5,243,149 A | 9/1993 | Comerford et al. |
| 5,247,137 A | 9/1993 | Epperson |
| 5,253,336 A | 10/1993 | Yamada |
| 5,280,289 A | 1/1994 | Root |
| 5,288,986 A | 2/1994 | Pine et al. |
| 5,294,792 A | 3/1994 | Lewis et al. |
| 5,335,150 A | 8/1994 | Huang |
| 5,365,598 A | 11/1994 | Sklarew |
| 5,394,487 A | 2/1995 | Burger et al. |
| 5,398,082 A | 3/1995 | Henderson et al. |
| 5,414,227 A | 5/1995 | Schubert et al. |

(Continued)

FOREIGN PATENT DOCUMENTS

CN    1303494    7/2001

(Continued)

OTHER PUBLICATIONS

U.S. Appl. No. 11/066,800, filed Feb. 25, 2005, Wang, et al.

(Continued)

*Primary Examiner*—Jon Chang
(74) *Attorney, Agent, or Firm*—Perkins Coie LLP

(57) ABSTRACT

A fast decoding technique for decoding a position of a bit in a pattern provided on a media surface that can generate large amounts of solution candidates quickly by switching or flipping bits and utilizing a recursion scheme. The fast decoding technique may be employed to simultaneously decode multiple dimensions of a pattern on the media surface.

20 Claims, 12 Drawing Sheets

U.S. PATENT DOCUMENTS

| | | | |
|---|---|---|---|
| 5,414,538 A | 5/1995 | Eschbach | |
| 5,442,147 A | 8/1995 | Burns et al. | |
| 5,448,372 A | 9/1995 | Axman et al. | |
| 5,450,603 A | 9/1995 | Davies | |
| 5,454,054 A | 9/1995 | Iizuka | |
| 5,471,533 A | 11/1995 | Wang et al. | |
| 5,477,012 A | 12/1995 | Sekendur | |
| 5,511,156 A | 4/1996 | Nagasaka | |
| 5,546,515 A | 8/1996 | Mochizuki | |
| 5,581,637 A | 12/1996 | Cass et al. | |
| 5,581,682 A | 12/1996 | Anderson et al. | |
| 5,587,558 A | 12/1996 | Matsushima et al. | |
| 5,612,524 A | 3/1997 | Sant'Anselmo et al. | |
| 5,626,620 A | 5/1997 | Kieval et al. | |
| 5,629,499 A | 5/1997 | Flickinger et al. | |
| 5,635,697 A | 6/1997 | Shellhammer et al. | |
| 5,644,652 A | 7/1997 | Bellegarda et al. | |
| 5,652,412 A | 7/1997 | Lazzouni et al. | |
| 5,661,291 A | 8/1997 | Ahearn et al. | |
| 5,661,506 A | 8/1997 | Lazzouni et al. | |
| 5,670,897 A | 9/1997 | Kean | |
| 5,686,718 A | 11/1997 | Iwai et al. | |
| 5,692,073 A | 11/1997 | Cass | |
| 5,719,884 A | 2/1998 | Roth et al. | |
| 5,721,940 A | 2/1998 | Luther et al. | |
| 5,726,435 A | 3/1998 | Hara et al. | |
| 5,727,098 A | 3/1998 | Jacobson | |
| 5,748,808 A | 5/1998 | Taguchi et al. | |
| 5,754,280 A | 5/1998 | Kato et al. | |
| 5,756,981 A | 5/1998 | Roustaei et al. | |
| 5,765,176 A | 6/1998 | Bloomberg | |
| 5,774,602 A | 6/1998 | Taguchi et al. | |
| 5,817,992 A | 10/1998 | D'Antonio | |
| 5,818,436 A | 10/1998 | Imai et al. | |
| 5,822,436 A | 10/1998 | Rhoads | |
| 5,822,465 A | 10/1998 | Normile et al. | |
| 5,825,015 A | 10/1998 | Chan et al. | |
| 5,825,892 A | 10/1998 | Braudaway et al. | |
| 5,850,058 A | 12/1998 | Tano et al. | |
| 5,852,434 A | 12/1998 | Sekendur | |
| 5,855,483 A | 1/1999 | Collins et al. | |
| 5,855,594 A | 1/1999 | Olive et al. | |
| 5,875,264 A | 2/1999 | Carlstrom | |
| 5,890,177 A | 3/1999 | Moody et al. | |
| 5,897,648 A | 4/1999 | Henderson | |
| 5,898,166 A | 4/1999 | Fukuda et al. | |
| 5,902,968 A | 5/1999 | Sato et al. | |
| 5,937,110 A | 8/1999 | Petrie et al. | |
| 5,939,703 A | 8/1999 | Hecht et al. | |
| 5,960,124 A | 9/1999 | Taguchi et al. | |
| 5,961,571 A | 10/1999 | Gorr et al. | |
| 5,995,084 A | 11/1999 | Chan et al. | |
| 6,000,614 A | 12/1999 | Yang et al. | |
| 6,000,621 A | 12/1999 | Hecht et al. | |
| 6,000,946 A | 12/1999 | Snyders et al. | |
| 6,005,973 A | 12/1999 | Seybold et al. | |
| 6,014,462 A | 1/2000 | Yamakawa | |
| 6,041,335 A | 3/2000 | Merritt et al. | |
| 6,044,165 A | 3/2000 | Perona et al. | |
| 6,044,301 A | 3/2000 | Hartlaub et al. | |
| 6,052,481 A | 4/2000 | Grajski et al. | |
| 6,054,990 A | 4/2000 | Tran | |
| 6,076,734 A | 6/2000 | Dougherty et al. | |
| 6,081,261 A | 6/2000 | Wolff et al. | |
| 6,108,453 A | 8/2000 | Acharya | |
| 6,141,014 A | 10/2000 | Endo et al. | |
| 6,151,424 A | 11/2000 | Hsu | |
| 6,157,935 A | 12/2000 | Tran et al. | |
| 6,173,084 B1 | 1/2001 | Aach et al. | |
| 6,181,329 B1 | 1/2001 | Stork et al. | |
| 6,186,405 B1 | 2/2001 | Yoshioka | |
| 6,188,392 B1 | 2/2001 | O'Connor et al. | |
| 6,192,380 B1 | 2/2001 | Light et al. | |
| 6,202,060 B1 | 3/2001 | Tran | |
| 6,208,771 B1 | 3/2001 | Jared et al. | |
| 6,208,894 B1 | 3/2001 | Schulman et al. | |
| 6,219,149 B1 | 4/2001 | Kawata et al. | |
| 6,226,636 B1 | 5/2001 | Abdel-Mottaleb et al. | |
| 6,230,304 B1 | 5/2001 | Groeneveld et al. | |
| 6,243,071 B1 | 6/2001 | Shwarts et al. | |
| 6,249,614 B1 | 6/2001 | Kolesnik et al. | |
| 6,254,253 B1 | 7/2001 | Daum et al. | |
| 6,256,398 B1 | 7/2001 | Chang | |
| 6,259,827 B1 | 7/2001 | Nichani | |
| 6,278,968 B1 | 8/2001 | Franz et al. | |
| 6,294,775 B1 | 9/2001 | Seibel et al. | |
| 6,310,988 B1 | 10/2001 | Flores et al. | |
| 6,327,395 B1 | 12/2001 | Hecht et al. | |
| 6,330,976 B1 | 12/2001 | Dymetman et al. | |
| 6,335,727 B1 | 1/2002 | Morishita et al. | |
| 6,340,119 B2 | 1/2002 | He et al. | |
| 6,396,598 B1 | 5/2002 | Kashiwagi et al. | |
| 6,408,330 B1 | 6/2002 | DeLaHuerga | |
| 6,441,920 B1 | 8/2002 | Smith | |
| 6,479,768 B1 | 11/2002 | How | |
| 6,492,981 B1 | 12/2002 | Stork et al. | |
| 6,517,266 B2 | 2/2003 | Saund | |
| 6,522,928 B2 | 2/2003 | Whitehurst et al. | |
| 6,529,638 B1 | 3/2003 | Westerman | |
| 6,532,152 B1 | 3/2003 | White et al. | |
| 6,538,187 B2 | 3/2003 | Beigi | |
| 6,546,136 B1 | 4/2003 | Hull | |
| 6,551,357 B1 | 4/2003 | Madduri | |
| 6,560,741 B1 | 5/2003 | Gerety et al. | |
| 6,570,104 B1 | 5/2003 | Ericson et al. | |
| 6,570,997 B2 | 5/2003 | Noguchi | |
| 6,573,887 B1 | 6/2003 | O'Donnell, Jr. | |
| 6,577,299 B1 | 6/2003 | Schiller et al. | |
| 6,580,424 B1 | 6/2003 | Krumm | |
| 6,584,052 B1 | 6/2003 | Phillips et al. | |
| 6,585,154 B1 | 7/2003 | Ostrover et al. | |
| 6,592,039 B1 | 7/2003 | Smith et al. | |
| 6,603,464 B1 | 8/2003 | Rabin | |
| 6,625,313 B1 | 9/2003 | Morita et al. | |
| 6,628,267 B2 | 9/2003 | Karidis et al. | |
| 6,650,320 B1 | 11/2003 | Zimmerman | |
| 6,651,894 B2 | 11/2003 | Nimura et al. | |
| 6,655,597 B1 | 12/2003 | Swartz et al. | |
| 6,661,920 B1 | 12/2003 | Skinner | |
| 6,663,008 B1 | 12/2003 | Pettersson et al. | |
| 6,671,386 B1 | 12/2003 | Shimizu et al. | |
| 6,674,427 B1 | 1/2004 | Pettersson et al. | |
| 6,681,045 B1 | 1/2004 | Lapstun et al. | |
| 6,686,910 B2 | 2/2004 | O'Donnell, Jr. | |
| 6,689,966 B2 | 2/2004 | Wiebe | |
| 6,693,615 B2 | 2/2004 | Hill et al. | |
| 6,697,056 B1 | 2/2004 | Bergelson et al. | |
| 6,728,000 B1 | 4/2004 | Lapstun et al. | |
| 6,729,543 B1 | 5/2004 | Arons et al. | |
| 6,731,271 B1 | 5/2004 | Tanaka et al. | |
| 6,732,927 B2 | 5/2004 | Olsson et al. | |
| 6,738,053 B1 | 5/2004 | Borgstrom et al. | |
| 6,744,967 B2 | 6/2004 | Kaminski et al. | |
| 6,752,317 B2 | 6/2004 | Dymetman et al. | |
| 6,760,009 B2 | 7/2004 | Omura et al. | |
| 6,783,069 B1 | 8/2004 | Hecht et al. | |
| 6,819,776 B2 | 11/2004 | Chang | |
| 6,831,273 B2 | 12/2004 | Jenkins et al. | |
| 6,832,724 B2 | 12/2004 | Yavid et al. | |
| 6,834,081 B2 | 12/2004 | Kim et al. | |
| 6,834,195 B2 | 12/2004 | Brandenberg et al. | |
| 6,834,337 B1 | 12/2004 | Mitchell et al. | |
| 6,847,356 B1 | 1/2005 | Hasegawa et al. | |
| 6,856,712 B2 | 2/2005 | Fauver et al. | |

| | | |
|---|---|---|
| 6,862,371 B2 | 3/2005 | Mukherjee |
| 6,864,880 B2 | 3/2005 | Hugosson et al. |
| 6,865,325 B2 | 3/2005 | Ide et al. |
| 6,870,966 B1 | 3/2005 | Silverbrook et al. |
| 6,874,420 B2 | 4/2005 | Lewis, Jr. et al. |
| 6,879,731 B2 | 4/2005 | Kang et al. |
| 6,880,124 B1 | 4/2005 | Moore |
| 6,880,755 B2 | 4/2005 | Gorbet et al. |
| 6,897,854 B2 | 5/2005 | Cho et al. |
| 6,898,297 B2 | 5/2005 | Katsura et al. |
| 6,919,892 B1 | 7/2005 | Cheiky et al. |
| 6,929,183 B2 | 8/2005 | Pettersson |
| 6,933,933 B2 | 8/2005 | Fleming |
| 6,935,562 B2 | 8/2005 | Hecht et al. |
| 6,938,222 B2 | 8/2005 | Hullender et al. |
| 6,956,968 B1 | 10/2005 | O'Dell et al. |
| 6,960,777 B2 | 11/2005 | Soar |
| 6,964,483 B2 | 11/2005 | Wang et al. |
| 6,968,083 B2 | 11/2005 | Williams et al. |
| 6,970,183 B1 | 11/2005 | Monroe |
| 6,975,334 B1 | 12/2005 | Barrus |
| 6,976,220 B1 | 12/2005 | Lapstun et al. |
| 6,987,534 B1 | 1/2006 | Seta |
| 6,992,655 B2 | 1/2006 | Ericson et al. |
| 6,993,185 B2 | 1/2006 | Guo et al. |
| 6,999,622 B2 | 2/2006 | Komatsu |
| 7,003,150 B2 | 2/2006 | Trajkovi |
| 7,009,594 B2 | 3/2006 | Wang et al. |
| 7,012,621 B2 | 3/2006 | Crosby et al. |
| 7,024,429 B2 | 4/2006 | Ngo et al. |
| 7,036,938 B2 | 5/2006 | Wang et al. |
| 7,048,198 B2 | 5/2006 | Ladas et al. |
| 7,082,562 B2 * | 7/2006 | Lapstun et al. ............... 714/758 |
| 7,092,122 B2 | 8/2006 | Iwaki |
| 7,110,604 B2 | 9/2006 | Olsson et al. |
| 7,111,230 B2 | 9/2006 | Euchner et al. |
| 7,116,840 B2 | 10/2006 | Wang et al. |
| 7,119,816 B2 | 10/2006 | Zhang et al. |
| 7,120,853 B2 * | 10/2006 | Lapstun et al. ............... 714/781 |
| 7,123,742 B2 | 10/2006 | Chang |
| 7,133,031 B2 | 11/2006 | Wang et al. |
| 7,133,563 B2 | 11/2006 | Wang et al. |
| 7,136,054 B2 | 11/2006 | Wang et al. |
| 7,139,740 B2 | 11/2006 | Ayala |
| 7,142,197 B2 | 11/2006 | Wang et al. |
| 7,142,257 B2 | 11/2006 | Callison et al. |
| 7,145,556 B2 | 12/2006 | Pettersson |
| 7,167,164 B2 | 1/2007 | Ericson et al. |
| 7,176,906 B2 | 2/2007 | Williams et al. |
| 7,190,843 B2 | 3/2007 | Wei et al. |
| 7,222,799 B2 | 5/2007 | Silverbrook |
| 7,225,979 B2 | 6/2007 | Silverbrook et al. |
| 7,262,764 B2 | 8/2007 | Wang et al. |
| 7,263,224 B2 | 8/2007 | Wang et al. |
| 7,289,103 B2 | 10/2007 | Lapstun et al. |
| 7,292,370 B2 | 11/2007 | Iwaki |
| 7,293,240 B2 | 11/2007 | Lapstun et al. |
| 7,295,193 B2 | 11/2007 | Fahraeus |
| 7,330,605 B2 | 2/2008 | Wang et al. |
| 7,386,191 B2 | 6/2008 | Wang et al. |
| 7,400,777 B2 | 7/2008 | Wang et al. |
| 7,403,658 B2 | 7/2008 | Lin et al. |
| 7,421,439 B2 | 9/2008 | Wang et al. |
| 7,430,497 B2 | 9/2008 | Wang et al. |
| 7,440,134 B2 | 10/2008 | Natori |
| 7,440,583 B2 | 10/2008 | Tohne et al. |
| 7,463,784 B2 | 12/2008 | Kugo |
| 7,477,784 B2 | 1/2009 | Wang et al. |
| 7,486,822 B2 | 2/2009 | Wang et al. |
| 7,486,823 B2 | 2/2009 | Wang et al. |
| 7,502,508 B2 | 3/2009 | Wang et al. |
| 7,505,982 B2 | 3/2009 | Xu et al. |
| 7,528,848 B2 | 5/2009 | Xu et al. |
| 7,532,366 B1 * | 5/2009 | Yang et al. ................. 358/3.28 |
| 7,536,051 B2 | 5/2009 | Lin et al. |
| 7,542,976 B2 | 6/2009 | Wang et al. |
| 7,546,524 B1 * | 6/2009 | Bryar et al. ................. 715/230 |
| 7,570,813 B2 * | 8/2009 | Wang et al. ................. 382/188 |
| 7,580,576 B2 | 8/2009 | Wang et al. |
| 7,583,842 B2 | 9/2009 | Lin et al. |
| 2001/0024193 A1 | 9/2001 | Fahraeus |
| 2001/0038383 A1 | 11/2001 | Ericson et al. |
| 2001/0053238 A1 | 12/2001 | Katsura et al. |
| 2002/0028018 A1 | 3/2002 | Hawkins et al. |
| 2002/0031622 A1 | 3/2002 | Ippel et al. |
| 2002/0048404 A1 | 4/2002 | Fahraeus et al. |
| 2002/0050982 A1 | 5/2002 | Ericson |
| 2002/0069220 A1 | 6/2002 | Tran |
| 2002/0163511 A1 | 11/2002 | Sekendur |
| 2002/0179717 A1 | 12/2002 | Cummings et al. |
| 2003/0001020 A1 | 1/2003 | Kardach |
| 2003/0009725 A1 | 1/2003 | Reichenbach |
| 2003/0030638 A1 | 2/2003 | Astrom et al. |
| 2003/0034961 A1 | 2/2003 | Kao |
| 2003/0050803 A1 | 3/2003 | Marchosky |
| 2003/0081000 A1 | 5/2003 | Watanabe et al. |
| 2003/0088781 A1 | 5/2003 | ShamRao |
| 2003/0090475 A1 | 5/2003 | Paul et al. |
| 2003/0117378 A1 | 6/2003 | Carro |
| 2003/0118233 A1 | 6/2003 | Olsson |
| 2003/0128194 A1 | 7/2003 | Pettersson |
| 2003/0146883 A1 | 8/2003 | Zelitt |
| 2003/0159044 A1 | 8/2003 | Doyle et al. |
| 2003/0179906 A1 | 9/2003 | Baker et al. |
| 2003/0214553 A1 | 11/2003 | Dodge |
| 2003/0214669 A1 | 11/2003 | Saitoh |
| 2004/0032393 A1 | 2/2004 | Brandenberg et al. |
| 2004/0046744 A1 | 3/2004 | Rafii et al. |
| 2004/0085286 A1 | 5/2004 | Wang et al. |
| 2004/0085302 A1 | 5/2004 | Wang et al. |
| 2004/0086181 A1 | 5/2004 | Wang et al. |
| 2004/0090429 A1 | 5/2004 | Geaghan et al. |
| 2004/0128264 A1 | 7/2004 | Leung et al. |
| 2004/0128511 A1 | 7/2004 | Sun et al. |
| 2004/0153649 A1 | 8/2004 | Rhoads et al. |
| 2004/0212553 A1 | 10/2004 | Wang et al. |
| 2004/0233163 A1 | 11/2004 | Lapstun et al. |
| 2005/0024324 A1 | 2/2005 | Tomasi et al. |
| 2005/0044164 A1 | 2/2005 | O'Farrell et al. |
| 2005/0052700 A1 | 3/2005 | Mackenzie et al. |
| 2005/0104909 A1 | 5/2005 | Okamura et al. |
| 2005/0106365 A1 | 5/2005 | Palmer et al. |
| 2005/0146518 A1 | 7/2005 | Wang et al. |
| 2005/0147281 A1 | 7/2005 | Wang et al. |
| 2005/0193292 A1 | 9/2005 | Lin et al. |
| 2006/0082557 A1 | 4/2006 | Ericson et al. |
| 2006/0109263 A1 | 5/2006 | Wang et al. |
| 2006/0123049 A1 | 6/2006 | Wang et al. |
| 2006/0125805 A1 | 6/2006 | Marggraff |
| 2006/0182309 A1 | 8/2006 | Wang et al. |
| 2006/0182343 A1 | 8/2006 | Lin et al. |
| 2006/0190818 A1 | 8/2006 | Wang et al. |
| 2006/0215913 A1 | 9/2006 | Wang et al. |
| 2006/0242560 A1 | 10/2006 | Wang et al. |
| 2006/0242562 A1 | 10/2006 | Wang et al. |
| 2006/0242622 A1 | 10/2006 | Wang et al. |
| 2006/0267965 A1 | 11/2006 | Clary |
| 2006/0274948 A1 | 12/2006 | Wamg et al. |
| 2007/0001950 A1 | 1/2007 | Zhang et al. |
| 2007/0003150 A1 | 1/2007 | Xu et al. |
| 2007/0041654 A1 | 2/2007 | Wang et al. |
| 2007/0042165 A1 | 2/2007 | Wang et al. |
| 2008/0025612 A1 | 1/2008 | Wang et al. |
| 2009/0110308 A1 | 4/2009 | Wang et al. |

2009/0119573 A1    5/2009  Wang et al.

FOREIGN PATENT DOCUMENTS

| CN | 1352778 | 6/2002 |
|---|---|---|
| CN | 3143455 | 9/2003 |
| CN | 200610092487 | 9/2003 |
| EP | 0407734 | 1/1991 |
| EP | 0439682 | 8/1991 |
| EP | 0564708 | 10/1993 |
| EP | 0670555 | 9/1995 |
| EP | 0694870 | 1/1996 |
| EP | 0717368 | 6/1996 |
| EP | 0732666 | 9/1996 |
| EP | 0865166 | 9/1998 |
| EP | 1154377 | 11/2001 |
| EP | 1158456 | 11/2001 |
| EP | 1168231 | 1/2002 |
| EP | 1276073 | 1/2003 |
| EP | 1416435 | 5/2004 |
| GB | 2393149 | 3/2004 |
| JP | 63165584 | 7/1988 |
| JP | 04253087 | 9/1992 |
| JP | 06006316 | 1/1994 |
| JP | 06209482 | 7/1994 |
| JP | 06230886 | 8/1994 |
| JP | 07020812 | 1/1995 |
| JP | 07225564 | 8/1995 |
| JP | 10215450 | 8/1998 |
| JP | 11308112 | 11/1999 |
| JP | 2000131640 | 5/2000 |
| JP | 2002529796 | 9/2000 |
| JP | 2002082763 | 3/2002 |
| JP | 2002108551 | 4/2002 |
| WO | WO-9630217 | 10/1996 |
| WO | WO-9960469 | 11/1999 |
| WO | WO-9965568 | 12/1999 |
| WO | WO-0025293 | 5/2000 |
| WO | WO-0072247 | 11/2000 |
| WO | WO-0073983 | 12/2000 |
| WO | WO-0126032 | 4/2001 |
| WO | WO-0148685 | 7/2001 |
| WO | WO-0171654 | 9/2001 |
| WO | WO-02077870 | 10/2002 |
| WO | WO-03038741 | 5/2003 |
| WO | WO-2005106638 | 11/2005 |

OTHER PUBLICATIONS

U.S. Appl. No. 11/067,193, filed Feb. 25, 2005, Yang, et al.
U.S. Appl. No. 12/131,810, filed Jun. 2, 2008, Wang.
U.S. Appl. No. 12/138,339, filed Jun. 12, 2008, Wang.
U.S. Appl. No. 12/180,484, filed Jul. 25, 2008, Wang.
"VPEN, Revolutionizing Human Interaction With The Digital World™," OTM Technologies, pp. 1-6, Jul. 15, 2002.
Brush, A.J. et al., "Robust Annotation Positioning in Digital Documents," SIGCHI '01, Mar. 31-Apr. 4, 2001, ACM, Seattle, Washington, USA, pp. 285-292.
Cai, Z., "A New Decode Algorithm for Binary Bar Codes," Pattern Recognition Letters 15 (Dec. 1994), pp. 1191-1199.
Champaneria, "PADCAM: A Real-Time, Human-Centric Notetaking System," MIT Laboratory for Computer Science, Mar. 2002.
Clark et al., "Maximal and Near-Maximal Shift Register Sequences: Efficient Event Counters and Easy Discrete Logarithms," IEEE Transactions on Computers vol. 43, No. 5, pp. 560-568, May 1994.
Cotting, D. et al., "Embedding Imperceptible Patterns into Projected Images for Simultaneous Acquisition and Display," Proceedings of the Third IEEE and ACM International Symposium on Mixed and Augmented Reality, Nov. 2-5, 2004, IEEE Computer Society, Washington, DC, pp. 100-109.
Crowley et al., "*Thingss That See*," Communications of the A.C.M., vol. 43, No. 3, pp. 54-64, Mar. 2000.
Decurtins, C. et al., "Digital Annotation of Printed Documents," Proceedings of the Twelfth International Conference on Information and Knowledge Management Nov. 3-8, New Orleans, Louisiana, United States, CIKM'03. ACM 2003, pp. 552-555.
Dey, et al., "A Fast Algorithm for Computing the Euler Number of an Image and its VLSI Implementation," IEEE; 13th International Conference on VLSI Design, Jan. 2003.
Dumer et al., "Hardness of Approximating the Minimum Distance of a Linear Code," IEEE Symposium of Foundations of Computer Science, pp. 475-485, 1999.
European Search Report for Application No. EP 03021235; Applicant: Microsoft Corporation; Date of Mailing: Jun. 1, 2005 (2 pages).
European Search Report for Application No. EP 03021852; Applicant: Microsoft Corporation; Date of Mailing: Mar. 2, 2004 (3 pages).
European Search Report for Application No. EP 05000170.0-1527; Applicant: Microsoft Corporation; Date of Mailing: Jan. 6, 2005 (7 pages).
European Search Report for Application No. 03021224.5; Applicant: Microsoft Corporation; Date of Mailing: Jun. 1, 2005 (3 pages).
European Search Report for Application No. 03021236.9; Applicant: Microsoft Corporation; Date of Mailing: Sep. 16, 2005 (5 Pages).
European Search Report for Application No. 03021237.7-1527, Applicant: Microsoft Corporation; Date of Mailing: Jan. 6, 2005 (4 pages).
European Search Report for Application No. EP050000749; Applicant: Microsoft Corporation; Date of Mailing: Apr. 26, 2007 (2 pages).
European Search Report, Application No. 03021238.5-1527; Applicant: Microsoft Corporation; Date of Mailing: Jun. 1, 2005 (6 pages).
Fujieda et al., "Development Of Pen-Shaped Scanners," Nec, vol. 51, No. 10, 1998.
Golovchinsky, G. and Denoue, L., "Moving Markup: Repositioning Freeform Annotations," UIST '02, Oct. 27-30, 2002, Paris, France, vol. 4, Issue 2, pp. 21-24.
Gonzalez, Rafael et al., "Digital Image Processing," Table of Contents and Preface, Second Edition, Prentice Hall, Upper Saddle River, New Jersey, 2002 (13 pages).
Grasso et al., "Augmenting Recommender Systems by Embedding Interfaces into Practices," pp. 267-275, 1999.
Guerrero, J.J. and Sagues, C. "From Lines to Homographies Between Uncalibrated Images," IX Symposium on Pattern Recognition and Image Analysis, VO4, 233-240, 2001.
Haynes, "Wacom PL-500," www.wacom.co.uk, Jul. 15, 2002.
Hecht, D.L., "Printed embedded data graphical user interfaces," Computer vol. 34, Issue 3, Mar. 2001, pp. 47-55.
IEEExplore # Search Session History, May 7, 2008, http://ieee.org/search/history.jsp, 1 page.
International Search Report for Application No. PCT/US2006/032230; Applicant: Microsoft Corporation; Date of Mailing: Jan. 9, 2007 (3 pages).
Internet Print Out: "(Electro-Magnetic Resonance) send and position sensing technology," Wacom, Technology, http://www.wacom-components.com/tech.asp, pp. 1-6, Jul. 15, 2002.
Internet Print Out: "Anoto Pen Bluetooth," Tabletpccorner, http://www.tabletpccorner.net, dated Sep. 5, 2003.
Internet Print Out: "Competitive Technologies' Investee Introduces N-Scribe Pen—Digital Ink Presents Wireless Pen At Demo 2001," Competitive Technologies, http://www.competitivetech, dated Sep. 5, 2003.
Internet Print Out: "Cordless Batteryless Pen," Wacom Penabled, Components, http://www.wacom.com/components/index.cfm, dated Jul. 15, 2002.
Internet Print Out: "DataGlyphs®: Embedding Digital Data," Parc Solutions, http://www.parc.com/solutions/dataglyphs/, dated Jul. 15, 2002.
Internet Print Out: "Digital Pens," http://www.anotofunctionality.com/navigate.asp?PageID=96, pp. 1-70, Sep. 26, 2002.
Internet Print Out: "Jot This—Nscribe Pen," PC Magazine, http://ww.pcmag.com/article2/0,4149,316500,00.asp, dated Jul. 15, 2002.
Internet Print Out: "Jot This—Nscribe Pen," PC Magazine, http://ww.pcmag.com/article2/0,4149,316500,00.asp, dated Sep. 5, 2003.
Internet Print Out: "Maxell Digital Pen to Use Anoto System," Gizmo, http://www.gizmo.com.au/, dated Sep. 5, 2003.
Internet Print Out: "Mimio—Products," Mimio, http://www.mimio.com, pp. 1-8, Sep. 5, 2003.

Internet Print Out: "N-Scribe for Digital Writing," Flash Commerce News, http://flashcommerce.com/articles/, dated Sep. 5, 2003.
Internet Print Out: "N-Scribe for Digital Writing," Mobileinfo.com, News issue #2001—15 (Apr. 2001), http://www.mobileinfo.com/News_2001/Issue15/Digital-nscribe.htm, dated Jul. 15, 2002.
Internet Print Out: "Navilite—Optical Opportunities—Bluetooth-enabled optical transition measurement technology paves the way for an untethered stylus that can write on any surface," vol. 8, Issue No. 34, Jul. 5-11, 2002. www.computerworld.com, dated Aug. 15, 2002.
Internet Print Out: "OTM Technologies—V Pen," searched http://www.otmtech.com/vpen3.asp, pp. 1-7, Jul. 15, 2002.
Internet Print Out: "PL-500—15.1 inch Screen Digital LCD Pen Tablet System," Wacom Graphics Tablet Solution, http://ap.wacm.co.jp/products/pl/contents/pl500.html, pp. 1-13, 2002.
Internet Print Out: "Preprocessing in the Npen++System," http://www.is.cs.cmu.edu/mie/multimodal_npen_preproc.html, dated Aug. 8, 2002.
Internet Print Out: "RF Pen Sends Your Scribbles," Appliance Manufacturing Magazine, http://www.ammagazine.com. Dated Sep. 26, 2002.
Internet Print Out: "SMART Board Interactive Whiteboard," Smarttech, http://www.smarttech.com, pp. 1-26, Sep. 5, 2003.
Internet Print Out: "The Hot New Medium: Paper—How the Oldest Interface in the Book is Redrawing the Map of the Networked World," http://www.wired.com/wired/, dated Sep. 5, 2003.
Internet Print Out: "Anoto functionality," News, dated Jul. 15, 2002.
Internet Print Out: "Anoto functionality," Showroom, dated Jul. 15, 2002.
Internet Print Out: "ChatPen CHA-30," Digital Pens, Anoto Functionality, dated Jul. 15, 2002.
Internet Print Out: "Cintiq18SX—A Powerful New Way to Work Directly on the Screen," Wacom Technology, Cintiq-Interactive Pen Display, dated Sep. 5, 2003.
Internet Print Out: "Communicate Digitally With Ordinary Pen and Paper," Anoto Functionality, dated Jul. 15, 2002.
Internet Print Out: "Creating a Global De Facto Standard," Anoto Functionality, dated Jul. 15, 2002.
Internet Print Out: "Daily News," dated Aug. 15, 2002.
Internet Print Out: "Digital Pens and Technical Data," Anoto Functionality, dated Jul. 15, 2002.
Internet Print Out: "Downloads," Anoto Functionality, dated Jul. 15, 2002.
Internet Print Out: "Optical Translation Measurement (OTM™)," Technologies, dated Jul. 15, 2002.
Internet Print Out: "Partners Supporting Anoto Functionality," Anoto Functionality, dated 15, 2002.
Internet Print Out: "Possibilities," Anoto Functionality, dated Jul. 15, 2002.
Internet Print Out: "Product VPen™," OTM Technologies, dated Jul. 15, 2002.
Internet Print Out: "Products—Get Everyone on the Same Page," Mimio, dated Sep. 5, 2003.
Internet Print Out: "Sensor Board and Pen," Wacom, Product, dated Jul. 15, 2002.
Internet Print Out: "The Solution," Anoto Functionality, dated Jul. 15, 2002.
Internet Print Out: "Vision and Mission," Anoto Functionality, dated Jul. 15, 2002.
Internet Print Out: "Wacom Displays Pressure-Sensitive Pen Sensor for Tablet PCs," Wacom, News, dated Jul. 15, 2002.
Internet Print Out: "Welcome To www.anoto.com," Anoto, dated Jul. 15, 2002.
Internet Printout—http://www.anoto.com: Construction, Sep. 5, 2003.
Internet Printout—http://www.anoto.com: Page template, Sep. 5, 2003.
Internet Printout—http://www.anoto.com: Paper and Printing, Sep. 5, 2003.
Internet Printout—http://www.anoto.com: Paper space, Sep. 5, 2003.
Internet Printout—http://www.anoto.com: Pattern, Sep. 5, 2003.
Internet Printout—http://www.anoto.com: Printers supporting Anoto functionality, Sep. 5, 2003.
Internet Printout—http://www.anotofunctionality.com: Anoto Functionality—Anoto pattern & digital paper, Sep. 26, 2002.
Internet Printout—http://www.anotofunctionality.com: Anoto Functionality—Anoto pattern & digital paper, Sep. 5, 2003.
Internet Printout—http://www.anotofunctionality.com: Anoto Functionality—Applications, Sep. 5, 2003.
Internet Printout—http://www.anotofunctionality.com: Anoto Functionality—Corporate applications, Sep. 5, 2003.
Internet Printout—http://www.anotofunctionality.com: Anoto Functionality—Digital notes, Sep. 5, 2003.
Internet Printout—http://www.anotofunctionality.com: Anoto Functionality—Digital paper, Sep. 26, 2002.
Internet Printout—http://www.anotofunctionality.com: Anoto Functionality—Digital paper, Sep. 5, 2003.
Internet Printout—http://www.anotofunctionality.com: Anoto Functionality—Digital pens Use with mobile phones, Sep. 5, 2003.
Internet Printout—http://www.anotofunctionality.com: Anoto Functionality—Digital Pens Use with personal computers, Sep. 26, 2002.
Internet Printout—http://www.anotofunctionality.com: Anoto Functionality—Digital Pens, Sep. 26, 2002.
Internet Printout—http://www.anotofunctionality.com: Anoto Functionality—Digital pens, Sep. 5, 2003.
Internet Printout—http://www.anotofunctionality.com: Anoto Functionality—Digital service, Sep. 26, 2002.
Internet Printout—http://www.anotofunctionality.com: Anoto Functionality—Digital service, Sep. 5, 2003.
Internet Printout—http://www.anotofunctionality.com: Anoto Functionality—E-mail, Sep. 5, 2003.
Internet Printout—http://www.anotofunctionality.com: Anoto Functionality—Fax, Sep. 5, 2003.
Internet Printout—http://www.anotofunctionality.com: Anoto Functionality—Freedom of expression, Sep. 26, 2002.
Internet Printout—http://www.anotofunctionality.com: Anoto Functionality—Graphical SMS, Sep. 5, 2003.
Internet Printout—http://www.anotofunctionality.com: Anoto Functionality—Hints & tips Using your digital paper, Sep. 5, 2003.
Internet Printout—http://www.anotofunctionality.com: Anoto Functionality—Hints & tips Using your digital pen, Sep. 5, 2003.
Internet Printout—http://www.anotofunctionality.com: Anoto Functionality—Hints & tips Using Your Digital Service, Sep. 5, 2003.
Internet Printout—http://www.anotofunctionality.com: Anoto Functionality—Hints & tips, Sep. 5, 2003.
Internet Printout—http://www.anotofunctionality.com: Anoto Functionality—How does it work?, Sep. 26, 2002.
Internet Printout—http://www.anotofunctionality.com: Anoto Functionality—Security, Sep. 5, 2003.
Internet Printout—http://www.anotofunctionality.com: Anoto Functionality—Software and additionals, Sep. 5, 2003.
Internet Printout—http://www.anotofunctionality.com: Anoto Functionality—What is Anoto functionality?, Sep. 5, 2003.
Internet Printout—http://www.anotofunctionality.com: Anoto Functionality—You to an organization, Sep. 26, 2002.
Internet Printout—http://www.anotofunctionality.com: Anoto Functionality—You to someone else, Sep. 26, 2002.
Internet Printout—http://www.anotofunctionality.com: Anoto Functionality—You to yourself, Sep. 26, 2002.
Internet Printout—http://www.anotofunctionality.com: Anoto® functionality brings digital life to paper products, Sep. 5, 2003.
Internet Printout—http://www.edgereview.com: The Edge—First Look: Digital Ink n-scribe, Sep. 5, 2003.
Internet Printout—http://www.flashcommerce.com: n-scribe for Digital Writing, Sep. 5, 2003.
Internet Printout—http://www.gizmo.com: Maxell Digital Pen to use Anoto system, Sep. 5, 2003.
Internet Printout—http://www.is.cs.cmu.edu: Final input representation, Aug. 8, 2002.
Internet Printout—http://www.is.cs.cmu.edu: Npen++, Aug. 8, 2002.
Internet Printout—http://www.mimio.com: Capture, Save and Share, Sep. 5, 2003.
Internet Printout—http://www.mimio.com: Mimio technology, Sep. 5, 2003.

Internet Printout—http://www.mimio.com: Turn your whiteboard into an interactive whiteboard, Sep. 5, 2003.

Internet Printout—http://www.pcmag.com: Jot This, Sep. 5, 2003.

Internet Printout—http://www.smarttech.com: Carnegie Mellon research ranks the SMART Board™ interactive whiteboard as fastest, most accurate way to interact with projected information, Sep. 5, 2003.

Internet Printout—http://www.smarttech.com: SMART Board Interactive Whiteboard—Front Projection Features, Sep. 5, 2003.

Internet Printout—http://www.smarttech.com: SMART Board Interactive Whiteboard—Q&A, Sep. 5, 2003.

Internet Printout—http://www.smarttech.com: SMART Board Interactive Whiteboard, Sep. 5, 2003.

Internet Printout—http://www.smarttech.com: SMART Camfire™, whiteboard camera system effortlessly saves dry-erase whiteboard notes, Sep. 5, 2003.

Internet Printout—http://www.smarttech.com: SMART Technologies Inc. awarded another U.S. patent for touch sensitive SMART Board™ technology, Sep. 5, 2003.

Internet Printout—http://www.smarttech.com: SMART Technologies, Inc. Press Releases, Sep. 5, 2003.

Internet Printout—http://www.smarttech.com: SMART Technologies, Inc., New annotation and software functionality on all SMART Board™ Interactive Whiteboards, Sep. 5, 2003.

Internet Printout—http://www.smarttech.com: What's New, Sep. 5, 2003.

Internet Printout—http://www.smarttech.com: Press Releases—SMART launches Research Assistance Program, Sep. 5, 2003.

Internet Printout—http://www.smarttech.com: SMART Board Interactive Whiteboard Profiles—Sep. 5, 2003.

Internet Printout—http://www.smarttech.com: SMART Board Software Features—Sep. 5, 2003.

Internet Printout—http://www.tabletpccorner.com: Anoto Pen Bluetooth, Sep. 5, 2003.

Internet Printout—http://www.techtv.com: Nscribe Pen and Presenter-to-Go, Sep. 5, 2003.

Internet Printout—http://www.wacom.com: Cintiq—Interactive Pen Display, Sep. 5, 2003.

Internet Printout—http://www.wacom.com: Graphire2—Have more fun with digital phones, Sep. 5, 2003.

Internet Printout—http://www.wacom.com: Intuos2—The Professional Tablet, Sep. 5, 2003.

Internet Printout—http://www.wacom.com: intuos2, Sep. 5, 2003.

Internet Printout—http://www.wacom.com: Penabled Wacom, Sep. 5, 2003.

Internet Printout—http://www.wacom.com: tablet PC, Sep. 5, 2003.

Internet Printout—http://www.wired.com: The Hot New Medium: Paper, Sep. 5, 2003.

Jelinek, Frederic, "Statistical Methods for Speech Recognition," The MIT Press, pp. 1-283, 2001.

Ko et al., "Finger Mouse and Gesture Recognition System As a New Human Computer Interface," Computer and Graphics, col. 21, No. 5, pp. 555-561, 1997.

Lau, R., "Adaptive Statistical Language Modeling," Submitted to the Dept. of Electrical Engineering and Computer Science in Partial Fulfillment for the Degree of Master of Science at the MIT, May 1994.

Lee, Kai-Fu, "Automatic Speech Recognition—The Development of the SPHINX System," Kluwer Academic Publishers, pp. 1-207, 1992.

Moran, et al., "Design and Technology for Collaborage: Collaborative Collages of Information on Physical Walls," Nov. 1999.

Munich, M.E.; Perona, P., "Visual Input for Pen-Based Computers," Image Processing, 1996, Proceedings International Conference on Sep. 16-19, 1996. vol. 1, pp. 173-176.

Nathan, K.S. et al., "On-Line Handwriting Recognition Using Continuous Parameter Hidden Markov Models," 1993 IEEE.

Okad, et al. "A Method for Document Digitizer by Real Time Assembling of Mosaic Pictures," Scripta Publishing Co., Systems, Computers, Controls, vol. 13, No. 5, Sep. 1982, pp. 74-80.

Okada et al., "A High-Resolution Handwriting Character Input Device Using Laser Beams," Department of Instrumentation Engineering, Faculty of Science and Technology, vol. 10.4, No. 11.1, 1981.

Otsu, Nobuyuki, "A Threshold Selection Method From Gray-Level Histogram," IEEE Transactions on Systems, Man, and Cybemetics; Jan. 1979, vol. SMC-9, No. 1, pp. 62-66.

Pursley, M. et al., "Numerical Evaluation of Correlation Parameters for Optimal Phrases of Binar Register Sequences," Communications, IEEE Transactions on Oct. 1979, vol. 27, Issue 10, Part 1, pp. 1597-1604.

Reynaerts, D. et al., "Design of an advanced computer writing tool," Micro Machine and Human Science, 1995, Proceedings of the Sixth International Symposium, Nagoya, Japan, Oct. 4-6, 1995, pp. 229-234.

Sato et al., "Novel device for Inputting Handwriting Trajectory," Ricoh Technical Report No. 27, Nov. 2001, pp. 52-59, http://www.ricoh.co.jp/rdc/techreport/No27/Ronbun/A2707.pdf.

Sato et al., "Video Tablet—2D Coordinate Input Device With OCD Camera," Osaka University, vol. J67-D, No. 6, Jun. 1984.

Shum, Heung-Yeung, et al., "Panoramic Image Mosaics," Microsoft Research Technical Report MSR-TR-97-23, 1997, 53 pages.

Tang, Xiaoou et al., "Video-based handwritten Chinese character recognition," Circuits and Systems for Video Technology, IEEE Transactions, Jan. 2005, vol. 15, Issue 1, pp. 167-174.

Urbanski, Brian, "Don't Break This Ink Pen," Edgereview.com, http://www.edgereview.com/ataglance.cfm?category=edge&ID=180, dated Jul. 15, 2002.

Urbanski, Brian, "Don't Break This Ink Pen," Edgereview.com, http://www.edgereview.com/ataglance.cfm?category=edge&ID=180, dated Sep. 5, 2003.

Urbanski, Brian, "Nscribe pen And Presenter-To-Go—Infrared Pen and New Springboard Module Make Their Debut At Demo 2001," Edgereview.com, http://www.techtv.com/freshgear.pr, dated Sep. 5, 2003.

Van Liere, R. and Mulder, J.D., "Optical Tracking Using Projective Invariant Marker Pattern Properties," Virtual Reality, 2003. Proceedings, IEEE, Mar. 22-26, 2003, pp. 191-198.

* cited by examiner

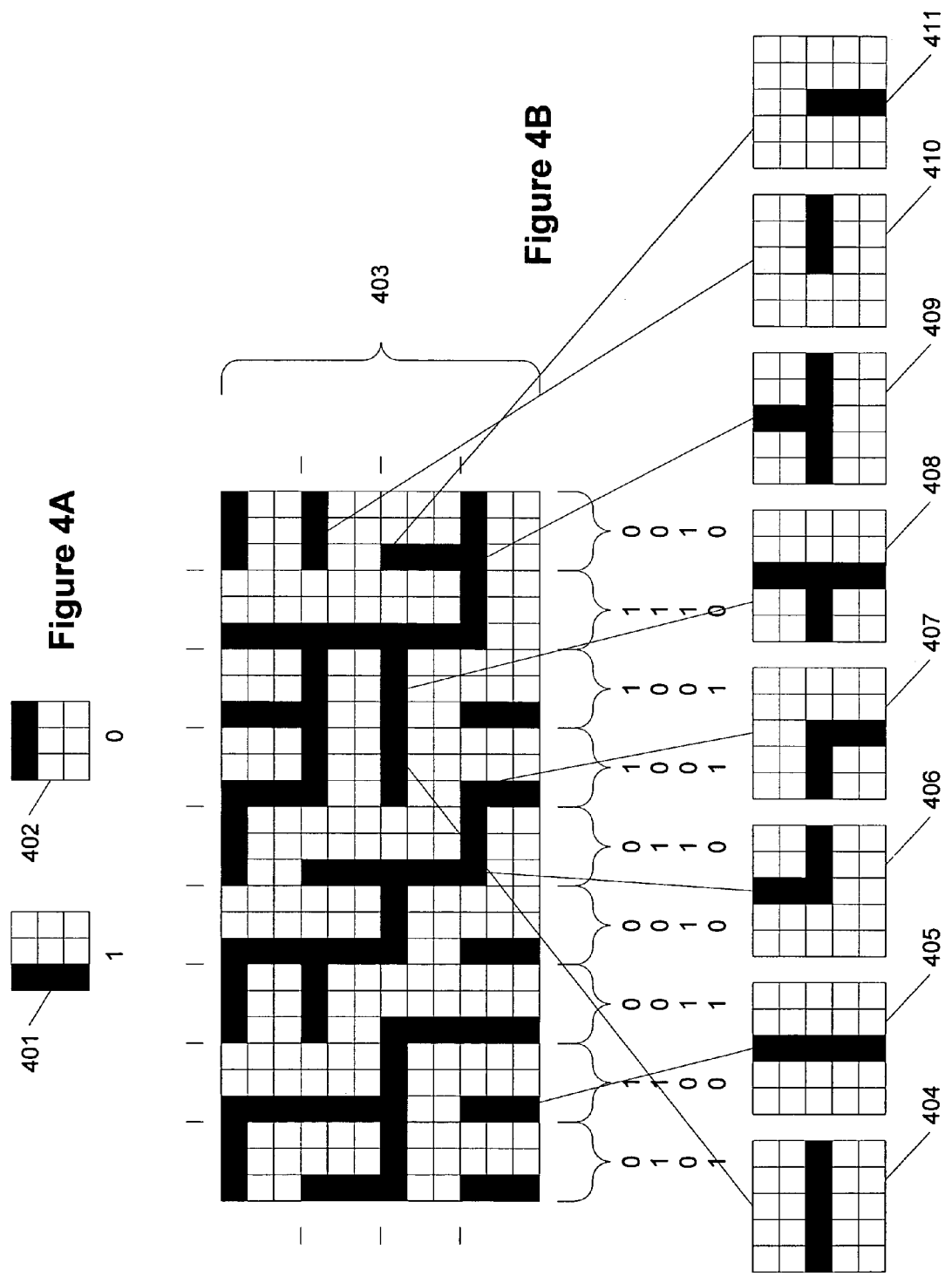

Figure 4F
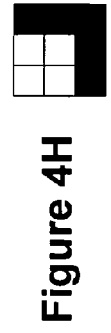
Figure 4G
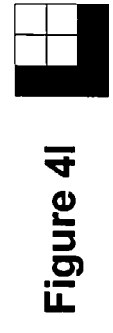
Figure 4H
Figure 4I
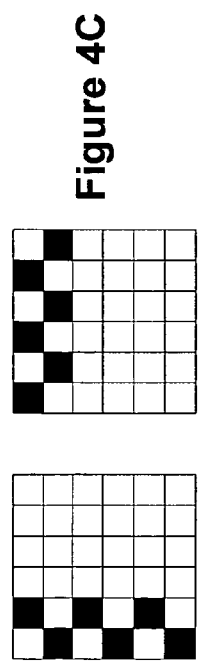
Figure 4C
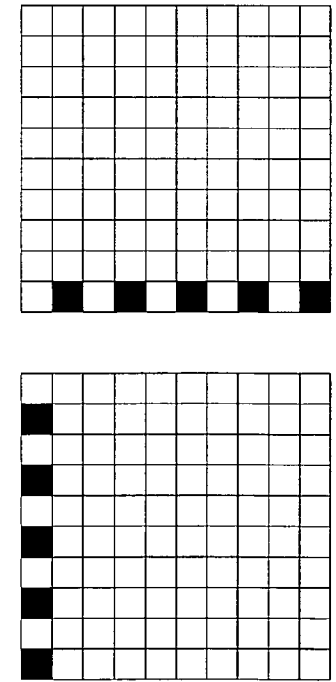
Figure 4D
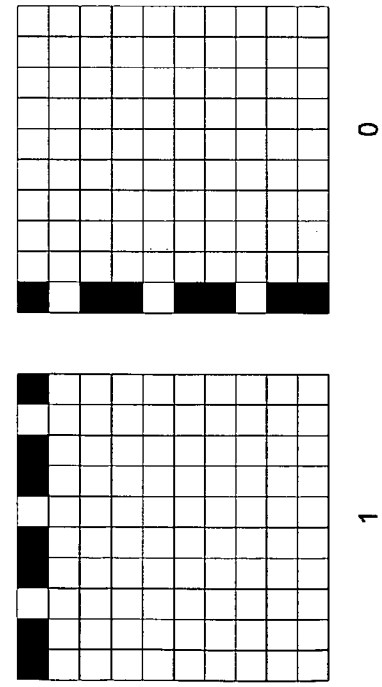
Figure 4E

| 00011010 | 00100100 | 10011100 | 01001111 | 00110110 | ... |
| 01100010 | 01000010 | 10010110 | 10101001 | 00100001 | |
| 01010010 | 00000110 | 10110100 | 10000101 | 00101101 | |
| 01101001 | 01100110 | 01011100 | 11111100 | 00111001 | |
| 11000101 | 11101111 | 11110101 | 00011101 | 10011100 | |
| 01111000 | 01010000 | 11000010 | 00110011 | 00011110 | |
| ... | | | | | |

— 501 (pointing to 00100001)

FAST ERROR-CORRECTING OF EMBEDDED INTERACTION CODES

FIELD OF THE INVENTION

The present invention relates to identifying sections of a linear code. Various aspects of the present invention are particularly applicable to identifying the location of marks on a document that make up sections of a linear code printed on the document.

BACKGROUND OF THE INVENTION

While electronic documents stored on computers provide a number of advantages over written documents, many users continue to perform some tasks with printed versions of electronic documents. These tasks include, for example, reading and annotating the documents. With annotations, the paper version of the document assumes particular significance, because the annotations typically are written directly onto the printed document. One of the problems, however, with directly annotating a printed version of a document is the difficulty in later converting the annotations into electronic form. Ideally, electronically stored annotations should correspond with the electronic version of the document in the same way that the handwritten annotations correspond with the printed version of the document.

Storing handwritten annotations in electronic form typically requires a user to review each handwritten annotation and personally enter it into a computer. In some cases, a user may scan the annotations written on a printed document, but this technique creates a new electronic document. The user must then reconcile the original version of the electronic document with the version having the scanned annotations. Further, scanned images frequently cannot be edited. Thus, there may be no way to separate the annotations from the underlying text of the original document. This makes using the annotations difficult.

To address this problem, pens have been developed to capture annotations written onto printed documents. In addition to a marking instrument, this type of pen includes a camera. The camera captures images of the printed document as a user writes annotations with the marking instrument. In order to associate the images with the original electronic document, however, the position of the images relative to the document must be determined. Accordingly, this type of pen often is employed with specialized media having a pattern printed on the writing surface. The pattern represents a code that is generated such that, the different section of the pattern that occur around a location on the media will uniquely identify that location. By analyzing or "decoding" this pattern, a computer receiving an image from the camera can thus determine what portions of the code (and thus what portion of a document printed on the paper) were captured in the image.

While the use of such patterned paper or other media allows written annotations on a paper document to be converted into electronic form and properly associated with the electronic version of the document, this technique presents its own difficulties. For example, the printed document itself may obscure areas of the pattern printed on the writing surface of the media. If the pen captures an image of one of these areas, then the computer may not be able to use the pattern to accurately determine the location of the document portion captured by the image. Also, the computer may not accurately recognize the code from the image. For example, if the code is binary, then the computer may erroneously recognize a portion of the pattern representing a "0" value as a "1" value, or vice versa.

Further, in some situations the unique positioning properties of the code cannot be utilized because the code values detected from the pattern are not consecutive, or the values do not have sufficient bits to uniquely identify a section of the code. Moreover, in order to stay in synchronism with the movement of the pen, the pattern captured in an image must be decoded within fixed time period. For example, if the pen captures about 100 images per second, the decoding time for each frame cannot exceed 10 ms. The possible solution candidates must therefore be generated and analyzed at a fast rate.

BRIEF SUMMARY OF THE INVENTION

Advantageously, various implementations of the invention provide a fast decoding technique that can generate large amount of solution candidates quickly by switching bits and utilizing a recursion scheme. Some implementations may further simplify the decoding technique so that the solution candidates are generated by bit reversal or "flipping." Still further, various implementations may be employed to simultaneously decode several sets or "dimensions" of patterns printed on the same media surface.

BRIEF DESCRIPTION OF THE DRAWINGS

FIGS. 4A-4E and 6 illustrate various code symbols for forming that may be used to form m-array patterns on a media surface according to various examples of the invention.

FIGS. 4F-4I illustrate various examples of "corner" combinations of pixels.

FIG. 5 illustrates one example of a multi-dimensional m-array.

DETAILED DESCRIPTION OF THE INVENTION

Operating Environment

Figure 1:
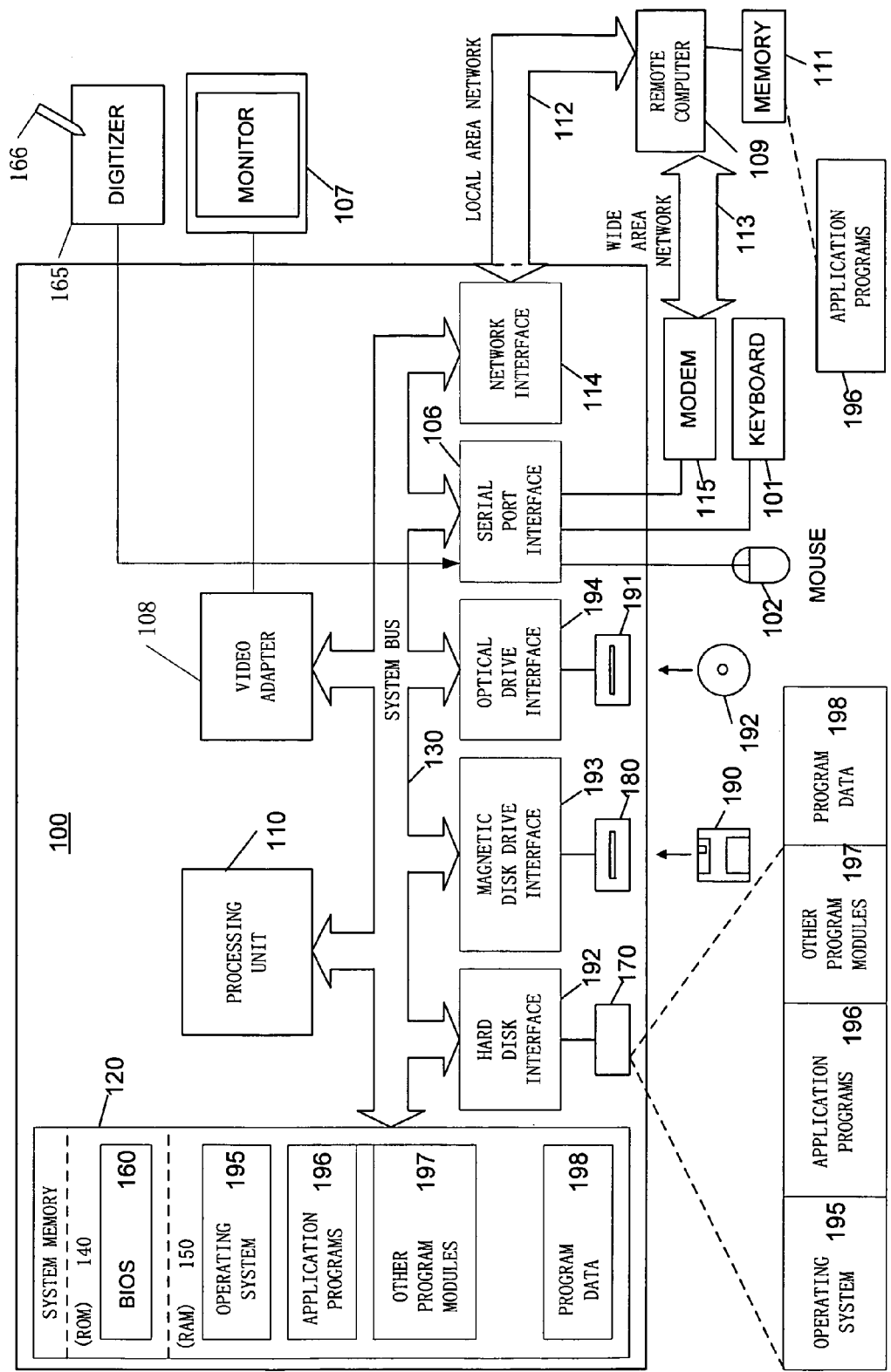
FIG. 1 illustrates an example of a programmable computing device that may be employed to implement various examples of the invention.

While some examples of the invention may be implemented using analog circuits, many examples of the invention may conveniently be implemented using a programmable computing device executing software instructions to perform various functions. FIG. 1 shows a functional block diagram of an example of a conventional general-purpose digital computing environment that may therefore be used to implement various aspects of the present invention. In FIG. 1, a computer 100 includes a processing unit 110, a system memory 120, and a system bus 130 that couples various system components including the system memory to the processing unit 110. The system bus 130 may be any of several types of bus structures including a memory bus or memory controller, a peripheral bus, and a local bus using any of a variety of bus architectures. The system memory 120 includes read only memory (ROM) 140 and random access memory (RAM) 150.

A basic input/output system 160 (BIOS), containing the basic routines that help to transfer information between elements within the computer 100, such as during start-up, is stored in the ROM 140. The computer 100 also includes a hard disk drive 170 for reading from and writing to a hard disk (not shown), a magnetic disk drive 180 for reading from or writing to a removable magnetic disk 190, and an optical disk drive 191 for reading from or writing to a removable optical disk 192 such as a CD ROM or other optical media. The hard disk drive 170, magnetic disk drive 180, and optical disk drive 191 are connected to the system bus 130 by a hard disk drive interface 192, a magnetic disk drive interface 193, and an optical disk drive interface 194, respectively. The drives and their associated computer-readable media provide nonvolatile storage of computer readable instructions, data structures, program modules and other data for the personal computer 100. It will be appreciated by those skilled in the art that other types of computer readable media that can store data that is accessible by a computer, such as magnetic cassettes, flash memory cards, digital video disks, Bernoulli cartridges, random access memories (RAMs), read only memories (ROMs), and the like, may also be used in the example operating environment.

A number of program modules can be stored on the hard disk drive 170, magnetic disk 190, optical disk 192, ROM 140 or RAM 150, including an operating system 195, one or more application programs 196, other program modules 197, and program data 198. A user can enter commands and information into the computer 100 through input devices such as a keyboard 101 and pointing device 102. Other input devices (not shown) may include a microphone, joystick, game pad, satellite dish, scanner or the like. These and other input devices are often connected to the processing unit 110 through a serial port interface 106 that is coupled to the system bus, but may be connected by other interfaces, such as a parallel port, game port or a universal serial bus (USB). Further still, these devices may be coupled directly to the system bus 130 via an appropriate interface (not shown). A monitor 107 or other type of display device is also connected to the system bus 130 via an interface, such as a video adapter 108. In addition to the monitor, personal computers typically include other peripheral output devices (not shown), such as speakers and printers. In a preferred embodiment, a pen digitizer 165 and accompanying pen or stylus 166 are provided in order to digitally capture freehand input. Although a direct connection between the pen digitizer 165 and the serial port is shown, in practice, the pen digitizer 165 may be coupled to the processing unit 110 directly, via a parallel port or other interface and the system bus 130 as known in the art. Furthermore, although the digitizer 165 is shown apart from the monitor 107, it is preferred that the usable input area of the digitizer 165 be co-extensive with the display area of the monitor 107. Further still, the digitizer 165 may be integrated in the monitor 107, or may exist as a separate device overlaying or otherwise appended to the monitor 107.

The computer 100 can operate in a networked environment using logical connections to one or more remote computers, such as a remote computer 109. The remote computer 109 can be a server, a router, a network PC, a peer device or other common network node, and typically includes many or all of the elements described above relative to the computer 100, although only a memory storage device 111 has been illustrated in FIG. 1. The logical connections depicted in FIG. 1 include a local area network (LAN) 112 and a wide area network (WAN) 113. Such networking environments are commonplace in offices, enterprise-wide computer networks, intranets and the Internet.

When used in a LAN networking environment, the computer 100 is connected to the local network 112 through a network interface or adapter 114. When used in a WAN networking environment, the personal computer 100 typically includes a modem 115 or other means for establishing a communications over the wide area network 113, such as the Internet. The modem 115, which may be internal or external, is connected to the system bus 130 via the serial port interface 106. In a networked environment, program modules depicted relative to the personal computer 100, or portions thereof, may be stored in the remote memory storage device.

It will be appreciated that the network connections shown are illustrative and other techniques for establishing a communications link between the computers can be used. The existence of any of various well-known protocols such as TCP/IP, Ethernet, FTP, HTTP, Bluetooth, IEEE 802.11x and the like is presumed, and the system can be operated in a client-server configuration to permit a user to retrieve web pages from a web-based server. Any of various conventional web browsers can be used to display and manipulate data on web pages.

Image Capturing Device

Various implementations of the invention may be employed to determine the location of an image taken of a portion of a surface area displaying a non-repeating pattern. As noted above, the surface may be the writing surface of a document printed on paper. It should be noted, however, that surface may also be the surface of a document rendered on a display screen or other medium displaying a document. Thus, according to some examples of the invention, the images may be obtained by an ink pen used to write ink on paper. With other examples of the invention, the pen may be a stylus used to "write" electronic ink on the surface of a digitizer displaying the document. Still further, the surface may be the surface of any media, regardless of whether a document is displayed thereon.

Figure 2:
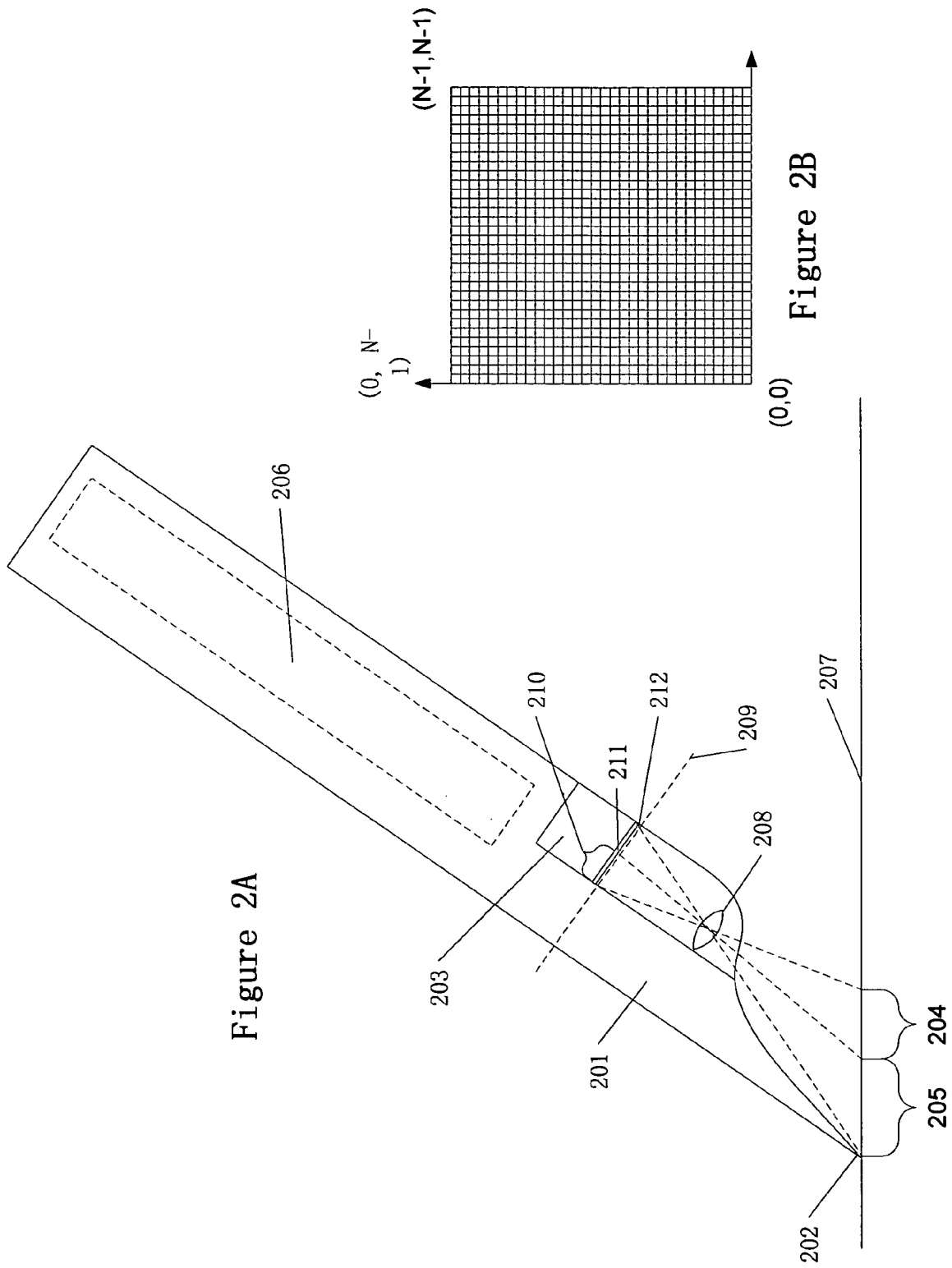
FIGS. 2A and 2B illustrate the configuration of a camera device that may be employed to capture images according to various examples of the invention.

FIGS. 2A and 2B show an illustrative example of a pen 201 that may be employed according to various examples of the invention used with paper media or the like. The pen 201 includes a tip 202 and a camera 203. The tip 202 that may or may not include an ink reservoir. The camera 203 captures an image 204 from surface 207. The pen 201 may further include additional sensors and/or processors as represented in broken box 206. These sensors and/or processors 206 may also include the ability to transmit information to another pen 201 and/or to a personal computer (for example, via a wired connection or via Bluetooth transmissions, infrared transmission, Wi-Fi transmission or other wireless protocol transmissions).

FIG. 2B represents an image as viewed by the camera 203. In one illustrative example, the resolution of an image captured by the camera 203 is N×N pixels (where, for example, N=32). Accordingly, FIG. 2B shows an example image 32 pixels long by 32 pixels wide. It should be appreciated that the size of N may vary with different implementations of the invention. A higher value of N will provide a higher image resolution. Also, while the image captured by the camera 203 is shown as a square for illustrative purposes, the field of view of the camera may be of any other desired shape as is known in the art.

The images captured by camera 203 may be defined as a sequence of image frames $\{I_i\}$, where $I_i$ is captured by the pen 201 at sampling time $t_i$. The sampling rate may be large or small, depending on the system configuration and performance requirement. The size of the captured image frame also may be large or small, depending on the system configuration and performance requirement. Further, it should be appreciated that an image captured by camera 203 may be used directly by a processing system, discussed in more detail below, which decodes a portion of a pattern captured in the image. Alternately, an image captured by the camera 203 may undergo pre-filtering before it is analyzed by the processing system. This pre-filtering may occur in the pen 201 or it may occur outside of the pen 201 (for example, in a personal computer).

FIG. 2A also shows the image plane 209 on which an image 210 of the pattern from location 204 is formed. Light received from the pattern on the object plane 207 is focused by lens 208. According to various embodiments of the invention, the lens 208 may be a single lens or a multi-part lens system, but is represented in FIG. 2A as a single lens for simplicity. Image capturing sensor 211 captures the image 210. The image sensor 211 may be large enough to capture the image 210. Alternatively, the image sensor 211 may be large enough to capture an image of the pen tip 202 at location 212. For reference, the image at location 212 will be referred to as the virtual pen tip. It should be noted that the virtual pen tip location is fixed with respect to image sensor 211, because of the constant relationship between the pen tip, the lens 208, and the image sensor 211.

Generating and Displaying a Pattern for Identifying a Position on a Medium

As previously noted, various examples of the invention are employed to determine the portion of a document captured in a pen image. With these examples, the medium displaying the document also displays a location pattern for identifying different positions on the medium. Thus, the pattern may be considered to be an encoded data stream in a displayed form. The medium displaying the pattern may be printed paper (or other type of permanent or semi-permanent medium). Alternately, the medium may be a display rendering the encoded data stream together with the image or set of images making up the document. With some examples of the invention, the encoded data stream may even be represented as a permanent or semi-permanent pattern overlaying a display screen (so that the position of any image captured by a pen is locatable with respect to the display screen).

In order to be useful for identifying a location in a document, the pattern should be sufficiently non-repetitive so that each portion of the document will have a unique portion of the pattern. One technique for providing such as pattern is to create a binary sequence, referred to herein as an "m-sequence," that can be arrayed over the area of the document without repeating.

An m-sequence may be generated by division of polynomials. More particularly, for every two polynomials $Q(x)$ and $P_n(x)$ over the finite field $F_2$, where $P_n(x)$ is a primitive polynomial of order n, and the order of $Q(x)$ is less than n, the division $Q(x)/P_n(x)$ generates an m-sequence m of the order n. For example, supposing that $P_n(X)=1+x+x^4$, $Q_1(x)=1+x+x^2$, the division $Q_1(x)/P_n(x)$ is shown below. For simplicity, only coefficients of the polynomials are shown. Here, $P_n(x)$ and $Q_1(x)$ are represented as (11001) and (11100) respectively, which are the coefficients of $x^0$, $x^1$, $x^2$, $x^3$ and $x^4$ in the two polynomials.

```
        1011001000111101...
11001/11100
       11001
       10100
       11001
        11010
        11001
         11000
         11001
          10000
          11001
           10010
           11001
            10110
            11001
             11110
             11001
              11100
               :
```

The result is an m-sequence $m_1=101100100011110\ldots$, with an order of 4 and a period of 15. It should be noted that the polynomials are over the finite field $F_2$. This means that the addition and multiplication of the polynomial coefficients follow the addition and multiplication of the finite field $F_2$, i.e. addition is XOR and multiplication is AND.

Figure 3:
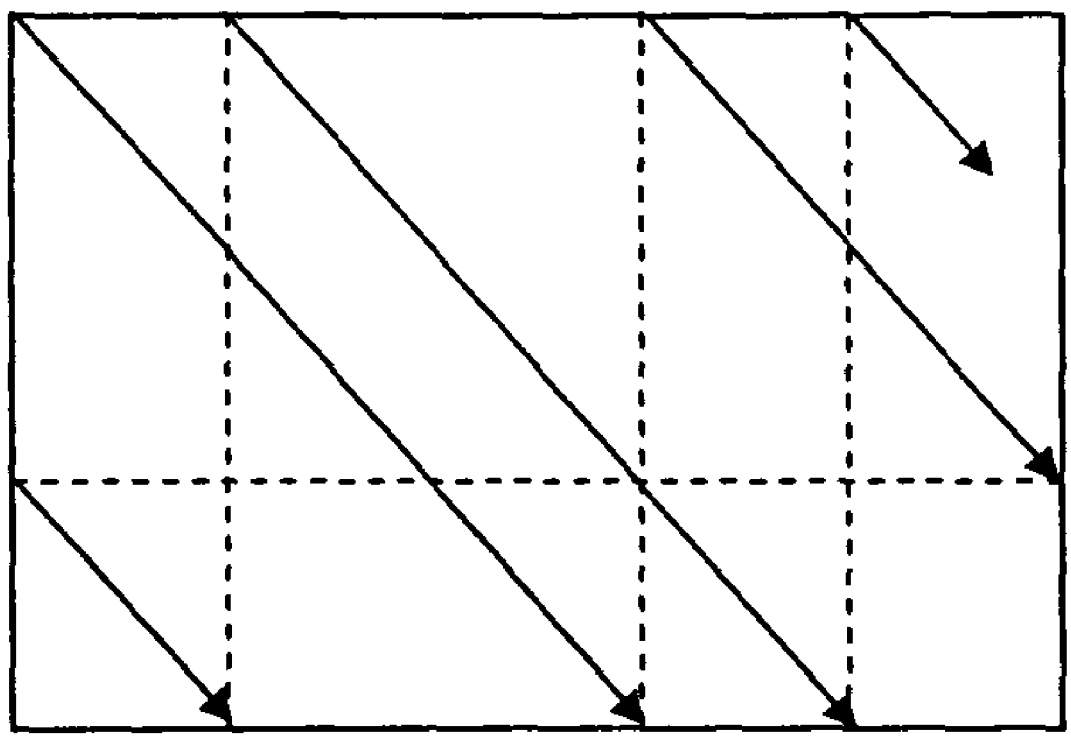
FIG. 3 illustrates the arrangement of bits in an m-array that may be employed according to various examples of the invention.

Next, the bits in an m-sequence can be regularly arranged over the writing surface of the document such that each bit in the m-sequence corresponds to a specific position in the document. One of the approaches for bit arrangement folds the m-sequence in the following manner, i.e., such that the bits of the m-sequence are arranged diagonally and continue from the opposite side whenever a boundary of the page area is met, so that the whole page is covered, as illustrated in FIG. 3.

FIG. 4A shows one example of encoding techniques for encoding a bit with a value of "1" and a bit with a value of "0" into a pattern for identifying positions on a medium. A code symbol for a first bit 401 (for example, with a value of "1") is represented by vertical column of dark ink or pixels. A code symbol for a second bit 402 (with, for example, a value of "0") is represented by a horizontal row of dark ink or pixels. It should be appreciated, however, that any color ink or pixels may be used to represent various pattern values. It should be appreciated, however, that the color of the chosen ink should provide sufficient contrast with the background of the medium to be differentiable by an image capturing system. In this example, each of the bit values illustrated in FIG. 4A is represented by a 3×3 matrix of dots. The size of the matrix may be modified to be any desired size, however, based upon the size and resolution of the image capture system being used to capture images of the medium. FIG. 4B illustrates how a pattern 403 can be formed that represents the various bit values 404-411 making up a data stream.

Alternative representations of bits with 0 and 1 values are shown in FIGS. 4C-4E. It should be appreciated that the representation of a one or a zero for the sample encodings of FIGS. 4A-3E may be switched without effect. FIG. 4C shows bit representations occupying two rows or columns in an interleaved arrangement. FIG. 4D shows an alternative arrangement of the pixels in rows and columns in a dashed form. Finally FIG. 4E show pixel representations in columns and rows in an irregular spacing format (e.g., two dark dots followed by a blank dot).

It should be noted that alternative grid alignments are also possible, including a rotation of the underlying grid to a non-horizontal and non-vertical arrangement (for example, where the correct orientation of the pattern is 45 degrees). Using a non-horizontal and vertical arrangement may, with some examples of the invention, help eliminate visual distractions for the user, as users may tend to notice horizontal and vertical patterns before other pattern orientations. For purposes of simplicity, however, the orientation of the grid (horizontal, vertical and any other desired rotation of the underlying grid) is referred to collectively as the predefined grid orientation.

Referring back to FIG. 4A, if a bit is represented by a 4 by 4 matrix of elements and an imaging system detects a dark row and two white rows in a 4×3 region, then that region is determined to have a value of zero (or, with a reverse arrangement, a value of one). If a 4×3 region is detected with dark column and two white columns, then that region is determined to have a value of one (or, with a reverse arrangement, a value of zero). Accordingly, if the size of the image 210 in FIG. 2B is 32×32 pixels and each bit encoding unit size is 4×3 pixels, then the number of captured encoded units should be approximately 100 units. If the bit encoding unit size is 5×5, then the number of captured encoded units should be approximately 46.

As previously noted, the graphical pattern 403 of FIG. 4B represents a specific bit stream. Graphical pattern 403 includes 12 rows and 18 columns. More particularly, the rows and columns are formed by a bit stream being converted into the graphical pattern 403 using bit representations 401 and 402. Thus, the pattern 403 of FIG. 4B may be viewed as having the following bit representation:

$$\begin{bmatrix} 0 & 1 & 0 & 0 & 0 & 1 & 1 & 1 & 0 \\ 1 & 1 & 0 & 0 & 1 & 0 & 0 & 1 & 0 \\ 0 & 0 & 1 & 1 & 1 & 0 & 0 & 1 & 1 \\ 1 & 0 & 1 & 0 & 0 & 1 & 1 & 0 & 0 \end{bmatrix}$$

Various bit streams may be used to create a pattern like the pattern 403 shown in FIG. 4B. As previously noted, a random or pseudo-random sequence of ones and zeros, such as an m-sequence, may be used. The bit sequence may be arranged in rows, in columns, diagonally, or following any other formulaic ordering. For example, the above matrix may be formed by the following bit stream if run left to right then down:

0100 0111 0110 0100 1000 1110 0111 0100 1100.

Alternately, the above matrix may be formed by the following bit stream if run top to bottom then right:

0101 1100 0011 0010 0110 1001 1001 1110 0010.

Still further, the above matrix may represent the following bit stream if run diagonally, and then wrapped:

0110 0000 0101 0101 1000 0011 1111 1010 1010.

FIG. 4B also includes enlargements of pixel blocks from image 403. The enlargements 404-411 show 5×5 pixel blocks. Pixel block 404 shows a dark row between white rows. Pixel block 405 shows a dark column between white columns. Pixel block 406 shows a bottom left corner. Pixel block 407 shows a top right corner. The pixel block 408 shows a dark column with half a dark row on the left. Pixel block 409 shows a dark row with half a dark column above the row. The pixel block 410 shows half a dark row. Pixel block 411 shows half a dark column. Analyzing the combination of pixel blocks, it should be appreciated that all combinations of pixels may be formed by the image segments found in pixel blocks 404-411. The type of pattern shown in FIG. 4B may be referred to as a "maze" pattern, as the line segments appear to form a maze with no area being completely enclosed on all four sides by the maze.

Upon initial consideration, it would be expected that each of the four "corner" combinations of pixels shown in FIGS. 4F-4I would be found in the maze pattern shown in the image 403. However, as seen in FIG. 4B, only three types of corners actually exist in the eight pixel blocks 404-411. In this example, there is no corner combination of pixels as shown in FIG. 4F. By choosing the image segments 401 and 402 to eliminate a type of corner in this manner, the orientation of a captured image based on the missing type of corner can be determined.

FIG. 4B also includes enlargements of pixel blocks from image 403. The enlargements 404-411 show 5×5 pixel blocks. Pixel block 404 shows a dark row between white rows. Pixel block 405 shows a dark column between white columns. Pixel block 406 shows a bottom left corner. Pixel block 407 shows a top right corner. The pixel block 408 shows a dark column with half a dark row on the left. Pixel block 409 shows a dark row with half a dark column above the row. The pixel block 410 shows half a dark row. Pixel block 411 shows half a dark column. Analyzing the combination of pixel blocks, it should be appreciated that all combinations of pixels may be formed by the image segments found in pixel blocks 404-411. The type of pattern shown in FIG. 4B may be referred to as a "maze" pattern, as the line segments appear to form a maze with no area being completely enclosed on all four sides by the maze.

Upon initial consideration, it would be expected that each of the four "corner" combinations of pixels shown in FIGS. 4F-4I would be found in the maze pattern shown in the image 403. However, as seen in FIG. 4B, only three types of corners actually exist in the eight pixel blocks 404-411. In this example, there is no corner combination of pixels as shown in FIG. 4F. By choosing the image segments 401 and 402 to eliminate a type of corner in this manner, the orientation of a captured image based on the missing type of corner can be determined.

Multidimensional Arrays

FIGS. 3-4I relate to one-dimensional arrays, where each bit corresponds to a single position in the array. Various examples of the invention, however, may employ multi-dimensional arrays. With multi-dimensional arrays, each position in the array includes a group of bits. For example, in the multi-dimensional array 501 shown in FIG. 5, each of the bit elements in the bit group 501 will have a different array value. More particularly, the first bit in the group, with the value "0," will have the array value (7, 4, 1) (represented $E_{7,4,1}$). The second bit in the group, also with the value "0," will have the array value (6, 4, 1) (represented $E_{6,4,1}$). The last bit in the group, with the value "1," will have the array value (0,4,1) (represented $E_{0,4,1}$).

Figures 5, 6:
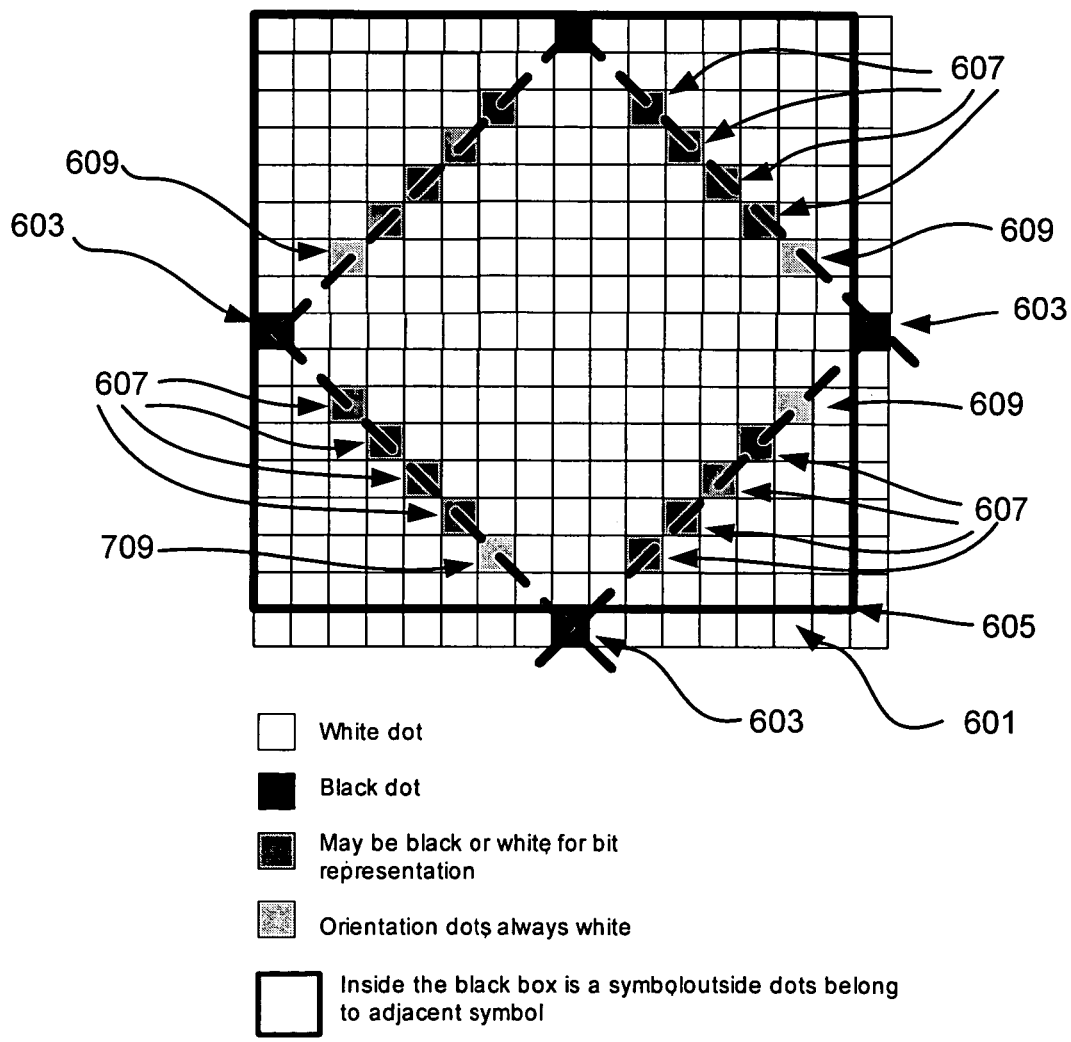

FIG. 6 then illustrates one example of a code symbol 601 that can be used to represent a multidimensional value in an array forming a location pattern. As seen in this figure, the code symbol has four black dark dots 603 that represent the border of the symbol 605. It also includes data dots 607 that can be either marked black or left white (or blank) to represent data bits. Still further, the illustrated code symbol includes orientation dots 607 that are always left white (or blank) to allow the decoding process to determine an orientation of the symbol.

As discussed herein, a code symbol is the smallest unit of visual representation of a location pattern. Generally, a code symbol will include the pattern data represented by the symbol. As shown in the illustrated example, one or more bits may be encoded in one code symbol. Thus, for a code symbol with 1 bit represented, the represented data may be "0" or "1", for a code symbol representing 2 bits, the represented data may be "00", "01", "10" or "11." Thus, a code symbol can represent any desired amount of data for the location pattern. The code symbol also will have a physical size. When the location pattern is, for example, printed on paper, the size of a code symbol can be measured by printed dots. For example, the illustrated code symbol is 16×16 printed dots. With a 600 dpi printer, the diameter of a printed dot will be about 0.04233 mm.

Still further, a code symbol will have a visual representation. For example, if a code symbol represents 2 bits, the visual representation refers to the number and position distribution of the black dots used to represent the data values "00", "01", "10" or "11". Thus, the code symbol illustrated in FIG. 3C may be referred to as a "8-a-16" symbol, since it represents 8 data bits using a 16×16 array of discrete areas. Of course, symbols having a variety of different represented pattern data values, sizes, and visual representation configurations will be apparent to those of ordinary skill in the art upon consideration of this description.

The bit values for the additional dimensions in a multidimensional array may conveniently be generated by cyclically shifting an original m-sequence to create a multidimensional m-array. More particularly, multiplying $Q(x)/P_n(x)$ by $x^k$ will result in an m-sequence that is the k-th cyclical shift of m. That is, letting $Q'(x)=x^k Q(x)$, if the order of $Q'(x)$ is still less than n, then the m-sequence m' generated by $Q'(x)/P_n(x)$ is the k-th cyclic shift of m, i.e. $m_2=\sigma^k(m)$. Here $\sigma^k(m)$ means cyclically-shifting m to the right by k times. For example, referring to the generation of the m-sequence described in detail above, if $Q_2(x)=x+x^2+x^3=xQ_1(x)$, the division $Q_2(x)/P_n(x)$ will generate an m-sequence $m_2=010110010001111$, which is the first cyclical shift of m, i.e. $m_2=\sigma^1(m_1)$.

Accordingly, cyclically shifted m-sequences may be formed into a multidimensional m-array. That is, the first bit in each group of bits may belong to a first m-sequence. The second bit in each group may then belong to a second m-sequence that is cyclically shifted by a value $k_1$ from the first m-sequence. The third bit in each group may then belong to a third m-sequence that is cyclically shifted by a value $k_2$ from the first m-sequence, and so on to form a multidimensional m-array.

As shown in FIG. 6, the physical positions of the bits of different m-sequences of a multidimensional m-array on the page are slightly different. Among the m-arrays, one dimension of the m-array (i.e., one cyclic shift of an m-sequence) is used for determining the pen position. The remaining m-arrays can then advantageously be used to embed some information, called metadata. For example, a document may have an identification number d. The second m-sequence used in a multidimensional m-array may then be a cyclic shift from the first m-array used for position determination, with the number of shifts being exactly d. Thus, when the values of the first and second m-sequences in the multidimensional m-array are decoded, the shift difference between can be determined to obtain the identification number d of the document. Of course, as will be appreciated by those of ordinary skill in the art, any desired information can be embedded as metadata in a multidimensional m-array as described above.

Decoding an M-Array

In order to determine the position of an image relative to a document using an m-array, it is necessary to determine the position of a bit captured in the bit relative to the m-array. That is, it is necessary to determine if the bit is the first bit, second bit, etc. in the m-sequence to determine the position of the bit in the m-array.

For any number s, where $0 \leq s < 2^n-1$, there exists a unique polynomial r(x), where $$r(x) = \sum_{i=0}^{n-1} r_i x^i$$

whose order is less than n, such that $x^s \equiv r(x)(\mod P_n(x))$, and vice versa. In other words, there is a one-to-one relationship between s and r(x). Thus, $x^s/P_n(x)$ and $r(x)/P_n(x)$ will generate the same m-sequence. For convenience, setting Q(x)=1, m can be assumed to be the m-sequence generated by $1/P_n(x)$. If a bit is the s'-th bit of m, where $0 \leq s' < 2^n-1$, the m-sequence that starts from that bit is $R=\sigma^{-s'}(m)=\sigma^{2^n-1-s'}(m)=\sigma^s(m)$, where $s=2^n-1-s'$. R corresponds to division $x^s/P_n(x)$.

As previously noted, there exists $$r(x) = \sum_{i=0}^{n-1} r_i x^i,$$

that satisfies $r(x) \equiv x^s (\mod P_n(x))$. R also corresponds to division $r(x)/P_n(x)$. Letting $m=(m_0\ m_1\ \ldots\ m_i\ \ldots\ m_{2^n-3}\ m_{2^n-2})^t$ (where the superscript t stands for vector or matrix transpose), and $\sigma^i(m^t)=(m_{2^n-1-i}\ m_{2^n-3}\ \ldots\ m_0\ \ldots\ m_{2^n-3-i}\ m_{2^n-2-i})$, $r(x)/P_n(x)$ and $1/P_n(x)$ will have the following relationship:

$$r(x)/P_n(x) = \left(\sum_{i=0}^{n-1} r_i x^i\right) / P_n(x) = \sum_{i=0}^{n-1} [r_i x^i / P_n(x)] = \sum_{i=0}^{n-1} r_i [x^i \cdot 1/P_n(x)].$$

With R corresponding to the division $r(x)/P_n(x)$, and $\sigma^i(m)$ corresponding to $x^i \cdot 1/P_n(x)$, then, $$R^t = r^t \hat{M}$$

where R is the m-sequence that starts from the s'-th bit of m, $r=(r_0\ r_1\ r_2\ \ldots\ r_{n-1})^t$ are the coefficients of r(x), and $$\hat{M} = \begin{pmatrix} m^t \\ \sigma(m^t) \\ \vdots \\ \sigma^{n-1}(m^t) \end{pmatrix}.$$

Again, the addition and multiplication operations are binary operations, i.e. addition is XOR and multiplication is AND.

If an image captures K bits $b=(b_0\ b_1\ b_2\ \ldots\ b_{K-1})^t$ of m ($K \geq n$), and the relative distances between the positions of the bits in the m-sequence are: $s_i = d(b_i, b_0)$, where $i=0, 1, \ldots, K-1$ and $s_0=0$, selecting the $s_i+1$-th bits of R and the $s_i+1$-th columns of $\hat{M}$ will result in:

$$b^t = r^t M$$

where $b^t$ is the transpose of b, M is a sub-matrix of $\hat{M}$ and consists of the $s_i+1$-th columns of $\hat{M}$, where $i=0, 1, 2, \ldots, K-1$.

If M is a non-degenerate matrix and b does not contain error bits, then r can be solved by selecting n bits from b by solving for:

$$r^t = b^t \tilde{M}^{-1}$$

where $\tilde{M}$ is any non-degenerate n×n sub-matrix of M, and $\tilde{b}$ is the corresponding sub-vector of b consisting of the selected n bits.

Stochastic Decoding of an M-Array

In most cases, however, an image cannot capture a set of bits b that do not contain error bits. For example, improper illumination, document content, dust and creases can all obscure the visual representation of bits in an image, preventing these bits from being recognized or causing the value of these bits to be improperly recognized. The solution of r becomes difficult when there are error bits in b. Further, decoding becomes even more difficult because the coefficient matrix M is not fixed when the pen moves, changing the image from frame to frame. Moreover, the structure of M is irregular. Therefore, traditional decoding algorithms cannot effectively be applied to solve r under practical circumstances.

To address these difficulties, various embodiments of invention provide stochastic solution techniques that provide a high decoding accuracy under practical conditions. As will be described in more detail, these techniques solve the equation $b^t = r^t M$ incrementally so that many solution candidates are readily available without having to solve this equation exactly.

According to various examples of the invention, independent n bits (i.e., the sub-matrix consisting of the corresponding columns of M is non-degenerate) are randomly selected from the group of b that are captured in an image of a document. Supposing that $b^{(0)}$ are the n bits chosen, a solution for r can then be obtained as:

$$[r^{(0)}]^t = [b^{(0)}]^t [M^{(0)}]^{-1}$$

where $M^{(0)}$ contains the corresponding columns of the array M for the chosen bits.

For simplicity, the n bits chosen from b to make up $b^{(0)}$ can be moved to the beginning of b, with the remaining bits making up $\bar{b}$ moved to the end of b. This leads to the relationship $$([b^{(0)}]^t, [\bar{b}^{(0)}]^t) = [r^{(0)}]^t (M^{(0)}, \bar{M}^{(0)}) + (0_n{}^t, [e^{(0)}]^t)$$

where $b^{(0)}$ are the chosen n bits, $\bar{b}^{(0)}$ are the remaining bits from the set b, $M^{(0)}$ is the corresponding columns of M for the chosen bits, $\bar{M}^{(0)}$ is the corresponding columns of M for the remaining bits, $0_n{}^t = (0\ 0\ \ldots\ 0)_{1 \times n}$, $[r^{(0)}]^t = [b^{(0)}]^t [M^{(0)}]^{-1}$, and $[e^{(0)}]^t = [\bar{b}^{(0)}]^t + [r^{(0)}]^t \bar{M}^{(0)}$.

The value $(0_n{}^t, [e^{(0)}]^t)$ refers to the "difference vector" between $([b^{(0)}]^t, [\bar{b}^{(0)}]^t)$ and $[r^{(0)}]^t (M^{(0)}, \bar{M}^{(0)})$, or simply the different vector of $r^{(0)}$, and the number of 1's in $(0_n{}^t, [e^{(0)}]^t)$ is called the number of different bits. The vector containing different bits between $([b^{(0)}]^t, [\bar{b}^{(0)}]^t)$ and $[r^{(0)}]^t (M^{(0)}, \bar{M}^{(0)})$ alternately can be identified as $D^{(0)}$. If $D^{(0)} = (0_n{}^t, [e^{(0)}]^t)$, then the number $d^{(0)}$ of 1's in $D^{(0)}$ is $d^{(0)} = \text{HammingWeight}(D^{(0)}) = \text{HammingWeight}(e^{(0)})$. That is, $d^{(0)}$ is the number of different bits between $([b^{(0)}]^t, [\bar{b}^{(0)}]^t)$ and $[r^{(0)}]^t (M^{(0)}, \bar{M}^{(0)})$.

Next, some of the chosen bits n from the set b are switched with some of the remaining bits from the set b. In particular, J bit pairs $(k_j, l_j)$ are switched between the original chosen bits n and the remaining bits from the set of bits b, where $k_1 \neq k_2 \neq \ldots \neq k_J \leq n$, $n < l_1 \neq l_2 \neq \ldots \neq l_J \leq K$. It should be noted that the bit order is redefined in $([b^{(0)}]^t, [\bar{b}^{(0)}]^t)$, and these bits are not maintained in their original order. The relationship between the bits before and after switching is:

$$[e^{(1)}]^t = [e^{(0)}]^t + [e^{(0)}]^t E_{l-n} [P_{R_J}^{(0)}]^{-1} (E_k^t P^{(0)} + E_{l-n}^t),$$

$$[r^{(1)}]^t = [r^{(0)}]^t + [e^{(0)}]^t E_{l-n} [P_{R_J}^{(0)}]^{-1} E_k^t [M^{(0)}]^{-1},$$

-continued $$P^{(1)} = P^{(0)} + (E_k + P^{(0)} E_{l-n}) [P_{R_J}^{(0)}]^{-1} (E_k^t P^{(0)} + E_{l-n}^t),$$

$$[M^{(1)}]^{-1} = [M^{(0)}]^{-1} + (E_k + P^{(0)} E_{l-n}) [P_{R_J}^{(0)}]^{-1} E_k^t [M^{(0)}]^{-1},$$

where $$E_k = (e_{k_1}\ e_{k_2}\ \ldots\ e_{k_J})_{n \times J},$$

$$E_{l-n} = (e_{l_1-n}\ e_{l_2-n}\ \ldots\ e_{l_J-n})_{(K-n) \times J},$$

$$P_{R_J}^{(0)} = E_k^t P^{(0)} E_{l-n}$$

$$e_i^t = (0\ \ldots\ 0\ \overset{i}{1}\ 0\ \ldots\ 0)_{1 \times n\ \text{or}\ 1 \times (K-n)}, \text{ and}$$

$$P^{(i)} = [M^{(i)}]^{-1} \bar{M}^{(i)}, i = 0, 1.$$

If the choice of $(k_j, l_j)$ is to make:

$$[e^{(0)}]^t E_{l-n} [P_{R_J}^{(0)}]^{-1} = 1_J{}^t,$$

where $1_J{}^t = (1\ 1\ \ldots\ 1)_{1 \times J}$, then $$[e^{(1)}]^t = [e^{(0)}]^t + 1_J{}^t (E_k{}^t P^{(0)} + E_{l-n}{}^t)$$

$$[r^{(1)}]^t = [r^{(0)}]^t + 1_J{}^t E_k{}^t [M^{(0)}]^{-1}.$$

In view of $[e^{(0)}]^t E_{l-n} [P_{R_J}^{(0)}]^{-1} = 1_J{}^t$ given $k_1 \neq k_2 \neq \ldots \neq k_J \leq n$, the choice of $n < l_1 \neq l_2 \neq \ldots \neq l_J \leq K$ is as follows: $\{l_1, l_2, \ldots, l_J\} \subset \{p_1, \ldots, p_m\}$, where $\{p_1, \ldots, p_m\}$ are the indices of the 0-bits of $[e^{(0)}]^t + 1_J{}^t E_k{}^t P^{(0)}$, and $P_{R_J}^{(0)}$ is invertible. Therefore, if the rank of $E_k{}^t P^{(0)} E_{p-n}$ is less than J, then such $l_1, l_2, \ldots, l_J$ cannot be chosen, where $E_{p-n} = (e_{p_1-n}\ e_{p_2-n}\ \ldots\ e_{p_m-n})_{(K-n) \times m}$. Choosing other $l_1, l_2, \ldots, l_J$ is equivalent to switching a smaller number of bit pairs, and therefore does not conform to the goal of switching J bits. It should be noted that, as long as the rank of $E_k{}^t P^{(0)} E_{p-n}$ is J, the choice of $l_1, l_2, \ldots, l_J$ will result in the identical location vector. Therefore, choosing one combination is sufficient. Moreover, as long as $P_{R_J}^{(0)}$ is invertible, the newly selected n bits are also independent.

With the above choice of $l_1, l_2, \ldots, l_J$, the number of different bits in $e^{(i+1)}$ is:

The number of 1's in $([e^{(0)}]^t + 1_J{}^t E_k{}^t P^{(0)}) + J$

It should be noted that $E_k{}^t P^{(0)} E_{l-n}$ actually means choosing the $k_1, \ldots, k_J$-th rows and $l_1-n, l_J-n$-th columns of $P^{(0)}$, while $1_J{}^t E_k{}^t P^{(0)}$ actually means summing the $k_1, \ldots k_J$-th rows of $P^{(0)}$. No matrix computation is needed.

Thus, the decoding steps can be summarized as follows. First, an independent n-bit combination is generated from the group of bits b captured in an image. It should be noted that, with various embodiments of the invention, the selection of the n-bits can be combined with bit recognition confidence techniques, to help ensure that the most accurately recognized bits are selected for the n-bit combination.

Next, the relationship $([b^{(0)}]^t, [\bar{b}^{(0)}]^t) = [r^{(0)}]^t (M^{(0)}, \bar{M}^{(0)}) + (0_n{}^t, [e^{(0)}]^t)$ is solved to determine $d^{(0)} = \text{HammingWeight}(D^{(0)}) = \text{HammingWeight}(e^{(0)})$. If the number of different bits $d^{(0)}$ is 0, then the process is stopped and the solution $r^{(0)}$ is output. Otherwise, all J (=1 and 2) bit pairs are switched, and the number of different bits d is again determined using the relationship $([e^{(0)}]^t + 1_J{}^t E_k{}^t P^{(0)}) + J$. It should be noted, however, that this relationship can only be evaluated when the rank of $E_k{}^t P^{(0)} E_{p-n}$ is J. In this case there is no need to specify $l_1, l_2, \ldots, l_J$. Next, the minimal number d of different bits is determined.

The above process has to be repeated for several times in order to ensure a high enough probability of successful decoding. To estimate the times of selecting the n-bit $b^{(0)}$ from b, the number r of the error bits in b is first predicted to be d. If r is changed, then $$p_s = \frac{C_r^s C_{K-r}^{n-s}}{C_K^n},$$

is computed, which is the probability of the chosen n bits contain s error bits, where $$C_a^b = \frac{a!}{b!(a-b)!}$$

is the combinatory number, and $$P_s = \sum_{i=0}^{s} p_i,$$

is the probability if the chosen n bits contain less than s+1 error bits. In practice, s=2 in order to minimize the computation load. Next, $s_2$ is computed, such that $1-(1-P_2)^{s_2} \geq P_e$, where $P_e$ is the expected probability of successful decoding. If the times S of chosen $b^{(0)}$ is equal to or larger than $s_2$, then the process is stopped and the results are output. Otherwise, the process is repeated with a new independent n-bit combination $b^{(0)}$ generated from the group of bits b captured in an image. Using this process, as long as the chosen n bits contain less than J+1 error bits, the correct solution is found.

Decoding Using "Bit-Flipping"

While the above-described technique can be used to determine the number of a bit in an m-sequence, this technique can be further simplified using "bit-flipping." As used herein, the term "bit flipping" refers to changing a bit with a value of "1" to a new value of "0," changing a bit with a value of "0" to a new value of "1."

Supposing $[b^{(1)}]^t$ is $[b^{(0)}]^t$ with J bits flipped, and the $k_i$-bits are the $k_i$-th bits of $[b^{(0)}]^t$, where i=1, 2, ..., J, $1 \leq k_1 \leq k_2 < ... < k_J \leq n$, then the relationship.

$$[r^{(1)}]^t = [b^{(1)}]^t [M^{(0)}]^{-1}$$

can be used to solve for a new r. It can be proven that:

$$([b^{(1)}]^t, [\overline{b}^{(0)}]^t) = [r^{(1)}]^t (M^{(0)}, \overline{M}^{(0)}) + (E_J, [e^{(0)}]^t + E_J P^{(0)})$$

and $$[r^{(1)}]^t = [r^{(0)}]^t + E_J [M^{(0)}]^{-1}$$

where $$E_J = \sum_{j=1}^{J} e_{k_j}^t, \quad e_i^t = \begin{pmatrix} 0 & ... & 0 & \overset{i}{1} & 0 & ... & 0 \end{pmatrix}_{1 \times n},$$

$P^{(0)} = [M^{(0)}]^{-1} \overline{M}^{(0)}$. Now, $D^{(1)} = (E_J, [e^{(0)}]^t + E_J P^{(0)})$, and the number of different bits $d^{(1)}$ is: $d^{(1)}$=HammingWeight $(D^{(1)})$=HammingWeight$([e^{(0)}]^t + E_J P^{(0)}) + J$. If $d^{(1)} < d^{(0)}$, then $r^{(1)}$ is a better solution of r than $r^{(0)}$.

The vector r is referred to as a location vector. Since division $x^s/P_n(x)$ and division $r(x)/P_n(x)$ generates the same m-sequence R, once r, i.e. the coefficients of r(x), is solved, s can be obtained by using a discrete logarithm. Therefore, s', the location of R in the original m-sequence m, can be obtained.

Methods for solving a discrete logarithm are well known in the art. For example, one technique for solving a discrete logarithm is described in "Maximal and Near-Maximal Shift Register Sequences: Efficient Event Counters and Easy Discrete Logarithms," Clark, D. W. and Weng, L-J., *IEEE Transactions on Computers*, 43(5), (1994), pp. 560-568, which is incorporated entirely herein by reference.

Thus, this simplified decoding process can be summarized by the following steps. First, n independent bits $b^{(0)}$ are randomly selected from the total set of bits b captured in an image of a document. The bits n may be randomly selected using, for example, Gaussian elimination. Once the bits n are selected, then the relationship $([b^{(0)}]^t, [\overline{b}^{(0)}]^t) = [r^{(0)}]^t (M^{(0)}, \overline{M}^{(0)}) + (0_n^t, [e^{(0)}]^t)$ is solved to determine r. If the Hamming-Weight value $d^{(0)}$ is 0, then the value of r is output and used to determine s' as described above, giving the position of this bit in the document.

If the value $d^{(0)}$ is not 0, then J bits of the chosen n bits are flipped, where $1 \leq J < n$, and the number of different bits using the equation $d^{(1)}$=HammingWeight$([e^{(0)}]^t + E_J P^{(0)}) + J$ is computed. Next, another set of n independent bits is selected, and the process is repeated. The new $b^{(0)}$ is different from all previous sets. Finally, the value of r is output that corresponds to the smallest d, i.e. the least number of different bits. In various implementations of the invention, up to two bits are flipped, and $b^{(0)}$ is only selected once.

Tool for Decoding an M-Array

Figure 7:
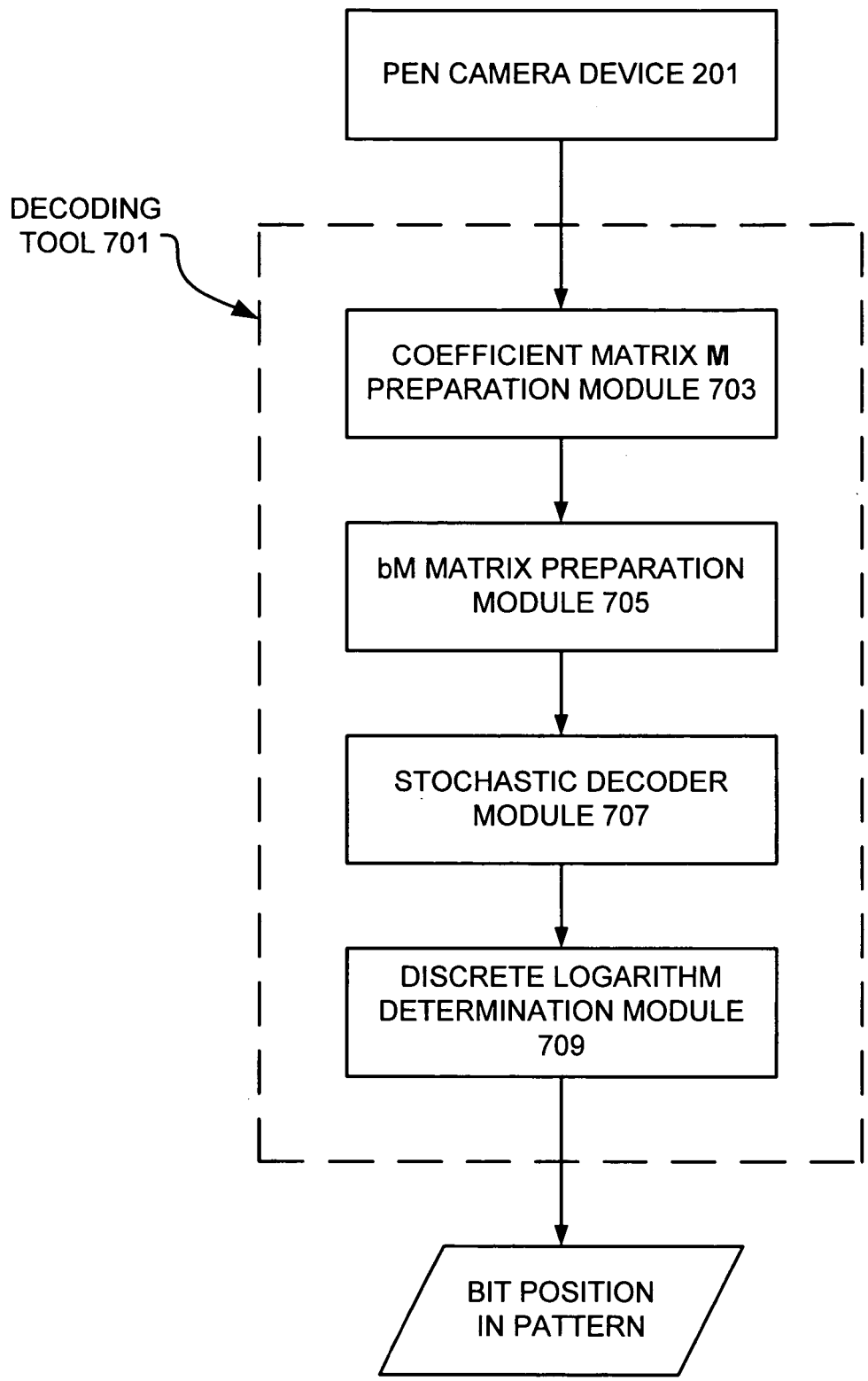
FIG. 7 illustrates an example of a decoding tool that may be implemented according to various examples of the invention.

FIG. 7 illustrates an example of a decoding tool 701 that may be implemented according to various examples of the invention. As seen in this figure, the tool 401 receives image information from a pen camera device 201, and provides a bit position in a pattern. The decoding tool 701 includes a coefficient matrix M preparation module 703 and a bM matrix preparation module 705. It also includes a stochastic decoder module 707 and a discrete logarithm determination module 709. With various examples of the invention, one or more of these modules may be implemented using analog circuitry. More typically, however, one or more of these modules will be implemented by software instruction executing on a programmable computer, such as the programmable computer shown in FIG. 1. Each of these modules 703-709 will be discussed in more detail below.

Coefficient Matrix M Preparation

Figure 8:
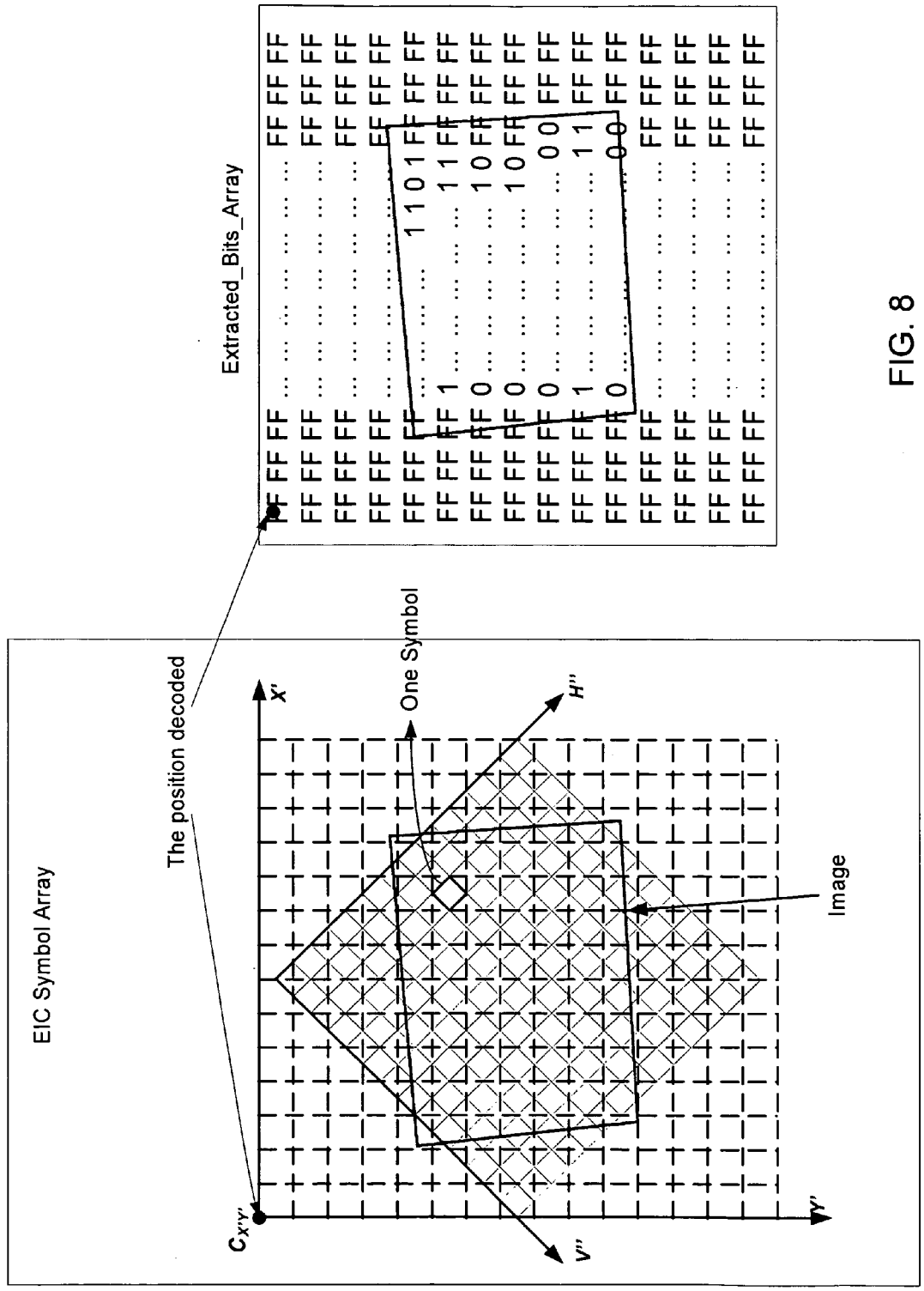
FIGS. 8-14 illustrate the creation of various arrays that may be employed during pattern decoding according to various examples of the invention.

In order to solve for r as discussed above, the arrays b and M are configured. First, all of the bits extracted for one dimension are stored in a matrix called Extracted_Bits_Array. For dimension b, where b=0, 1, ..., 7, the Extracted_Bits_Array (m, n)=$B_b^{m,n}$. As illustrated in FIG. 8, the bits extracted for one dimension are stored in Extracted_Bits_Array. In this figure, the null values are shown as "FF". FIG. 8 also indicates the position that will be determined by the decoding process. The decoded position is the position of the first element of the m-array stored in the Extracted_Bits_Array. In the case of the m-array representing positions using (x,y) Cartesian coordinates, the decoded position will be the coordinates of point $C_{X,Y}$ in the pattern array.

Once an Extracted_Bits_Array is created for a dimension, the total number of non-FF bits is counted. If the number is fewer than n, where n is the order of the m-array (in the illustrated example, n=28), then too few bits have been obtained to decode the array, and the decoding fails for this dimension. If the number is more than 2n, up to the 2n bits that have the highest recognition confidence values are kept, and "FF" is assigned to all other elements in the Extracted_Bits_Array.

In the illustrated example, it should be noted that the size of Extracted_Bits_Array is 20×20. This size is considered large enough to account for all possible positions of the extracted bits for a pattern encoded using an 8-a-16 symbol. That is, given the 128×100 pixel image sensor and the size of the symbol 8-a-16, a size 20×20 matrix is considered large enough to hold the bits in the image, regardless of how the image is rotated.

Figure 9:
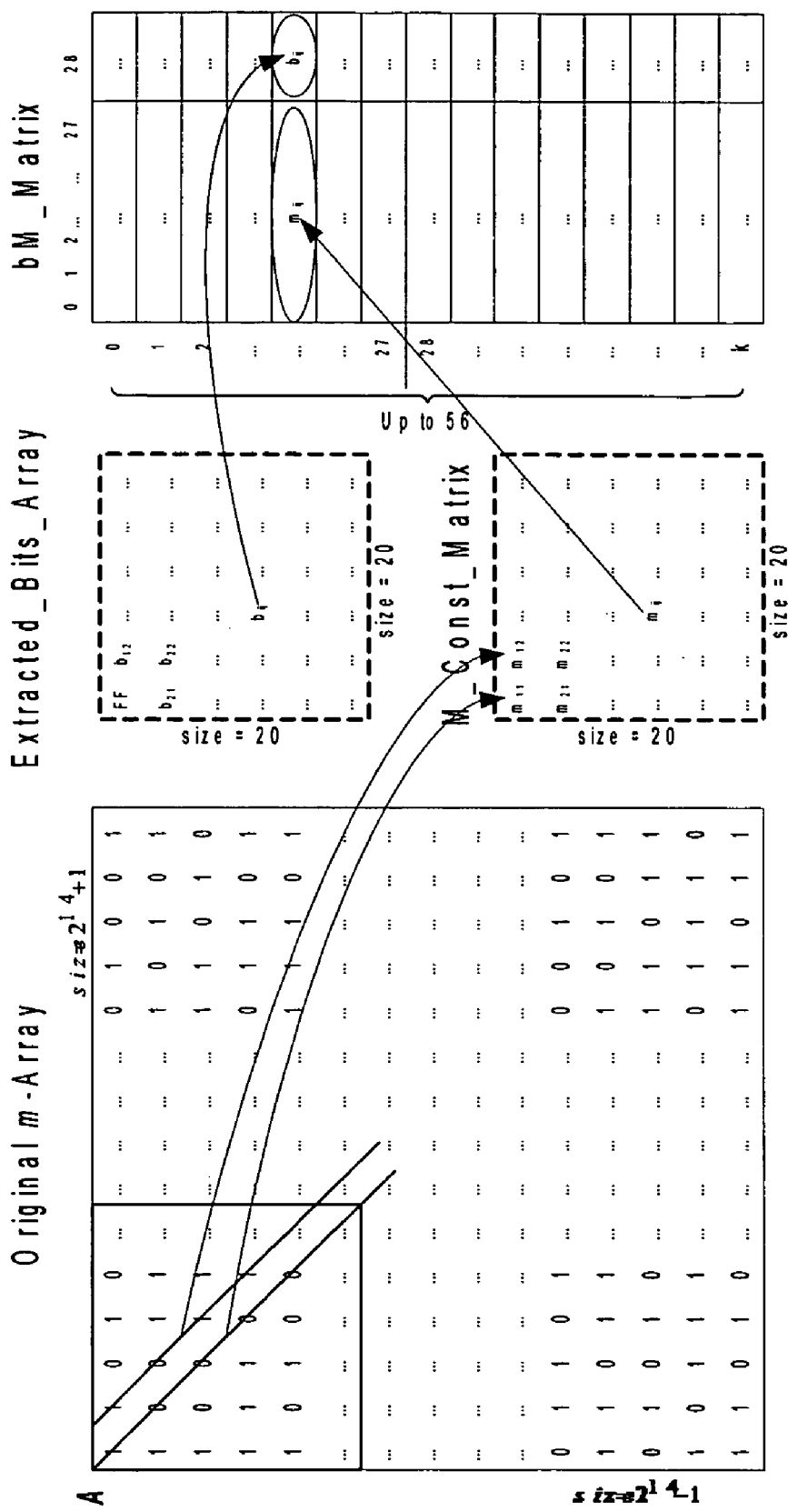

To obtain M, the coefficient matrix M preparation module 703 creates a matrix called M_Const_Matrix as a constant table. The size of M_Const_Matrix is the same as the size of Extracted_Bits_Array, i.e. 20×20 in the illustrated implementation. The M_Const_Matrix table is constructed in the following manner. For every i and j, where $1 \leq i \leq 20$, $1 \leq j \leq 20$, $$M(i,j)^T = (A(i,j), A(i+1,j+1), \ldots, A(i+26,j+26), A(i+27, j+27))^T$$

where A(i,j) is element (i,j) of the m-array based on the m-sequence m. FIG. 9 shows an illustration of how M_Const_Matrix is constructed.

Next, the bM matrix preparation module 705 constructs matrix bm_Matrix to contain b and M. For every non-FF bit in the Extracted_Bits_Array, the bM matrix preparation module 705 places the bit in the last column of bM_Matrix. Next, the corresponding element in M_Const_Matrix is retrieved (which is a vector), and that element is placed in the first n columns of the same row of bM_Matrix. With various examples of the invention, the bM matrix preparation module 705 may reorder th rows of bM_Matrix according to the recognition confidence of the corresponding bits, from highest to lowest. FIG. 9 for an illustration of how bM_Matrix is constructed. As a result, the first n columns of bM_Matrix is M (transposed). The last column of bM_Matrix is b. bM_Matrix has n+1 columns and up to 2n rows. For calculation purposes, another matrix, bM_Copy may be created, which is exactly the same as bM_Matrix.

Stochastic Decoding

Next, the stochastic decoder module 707 obtains a solution for r. More particularly, a first solution for r may be obtained with Gaussian elimination. In the bM_Matrix, through Gaussian elimination, n linearly independent bits are selected to solve for r. The process proceeds as follows. In bM_Matrix, starting from the first row down, a row is located that has a "1" in the first column. If it is not the first row of bM_Matrix, the row is switched with the first row of bM_Matrix. Next, in the bM_Matrix, the new first row (with a "1" in the first column) is used to perform a XOR operation with all the remaining rows that have a "1" in the first column and the result of the operation replaces the value of the original row. Now, all of the rows in bM_Matrix have a "0" in the first column except the first row, which has a "1" in the first column.

Figure 10:
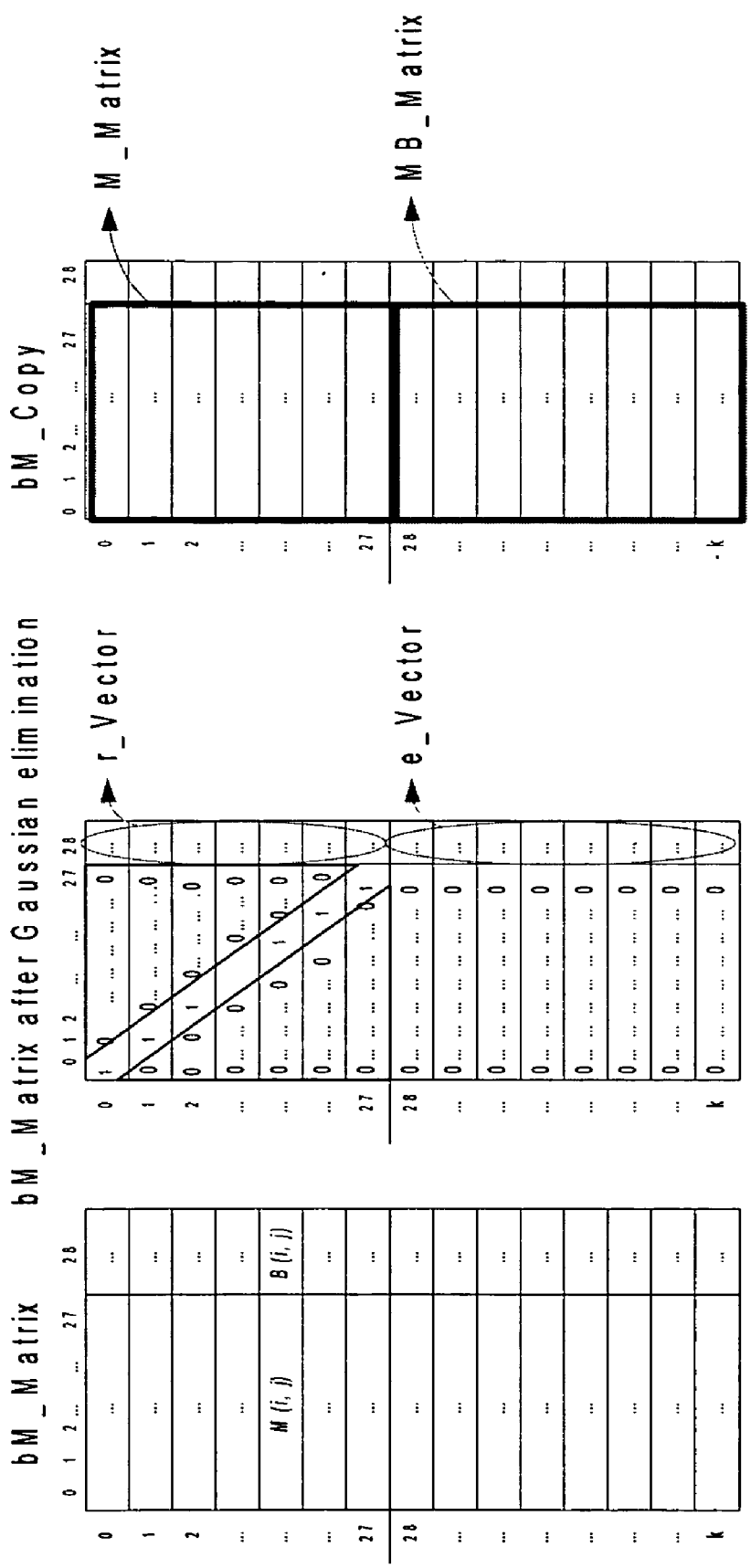

Next, starting from the second row down in the bM_Matrix, a row is identified that has a "1" in the second column. If it is not the second row of the bM_Matrix, this row is switched with the second row of bM_Matrix. In bM_Matrix, the new second row (with a "1" in the second column) to perform an XOR operation with all the remaining rows (including the first row of bM_Matrix) that have a "1" in the second column, letting the result replace the original value for the row. Now, all the rows in bM_Matrix have a "0" in the second column except the second row which has a "1" in the second column. This process continues until there is a "1" along the diagonal of the first n rows of bM_Matrix, as shown in FIG. 10.

The first n rows of bM_Matrix correspond to the n bits selected for solving r, i.e. $b^{(0)}$ as described above. The rest of the rows of bM_Matrix correspond to the rest of the bits, i.e. $\overline{b}^{(0)}$ also described above. Further, the last column of the first n rows of the bM_Matrix is the solution for $r^{(0)}$ noted above, which will be referred to as r_Vector here. The last column of the rest of the rows is $e^{(0)}$ noted above, which will be referred to as e_Vector here. Letting d be the number of 1's in e_Vector, d is the number of different bits, $d^{(0)}$, described above. If d=0, it means there are no error bits. The process is stopped, and r_Vector is output as the as the solution of r. If d>0, however, then there are error bits, and the process is continued.

In bM_Copy, the same row switching is done as in bM_Matrix, but no XOR operation is performed. The first n rows and n columns of bM_Copy is $M^{(0)}$ (transposed) as described above, which will be referred to as M_Matrix here. The rest of the rows and the first n columns of bM_Copy is the $\overline{M}^{(0)}$ (transposed) described above, which will be referred to as MB_Matrix here. From M_Matrix and MB_Matrix, MR_Matrix is obtained, which is $[M^{(0)}]^{-1}$ (transposed), and P_Matrix, which is $P^{(0)}$ described above:

MR_Matrix=M_Matrix$^{-1}$

P_Matrix=MB_Matrix·MR_Matrix

Because there may be error bits in b, it can be assumed that each of the n bits selected for solving r may be wrong, and its value "flipped" (i.e., the value changed from 0 to 1 or from 1 to 0) to solve for r again. If the new r results in a smaller d, the new r is a better solution for r, and $d_{min}$ is initialized as d.

For every flipped bit, to calculate the new d, it is not necessary to repeat the process of Gaussian elimination. As previously discussed, $d^{(1)}$=HammingWeight($[e^{(0)}]^t + E_J P^{(0)}$)+J, therefore if $[e^{(0)}]^t + E_J P^{(0)}$ can be obtained, then a new d is obtained.

Figure 11:
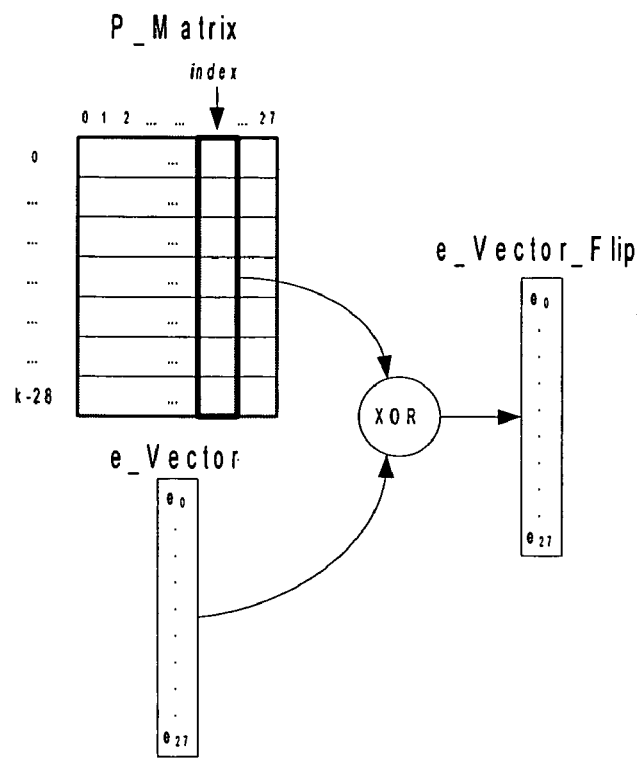

Accordingly, each of the n bits selected is flipped. For every column of P_Matrix, the column, the XOR operating is performed with e_Vector. The result is e_Vector_Flip. As illustrated in FIG. 11, e_Vector_Flip=$[e^{(0)}]^t + E_J P^{(0)}$, where J=1.

Figure 12:
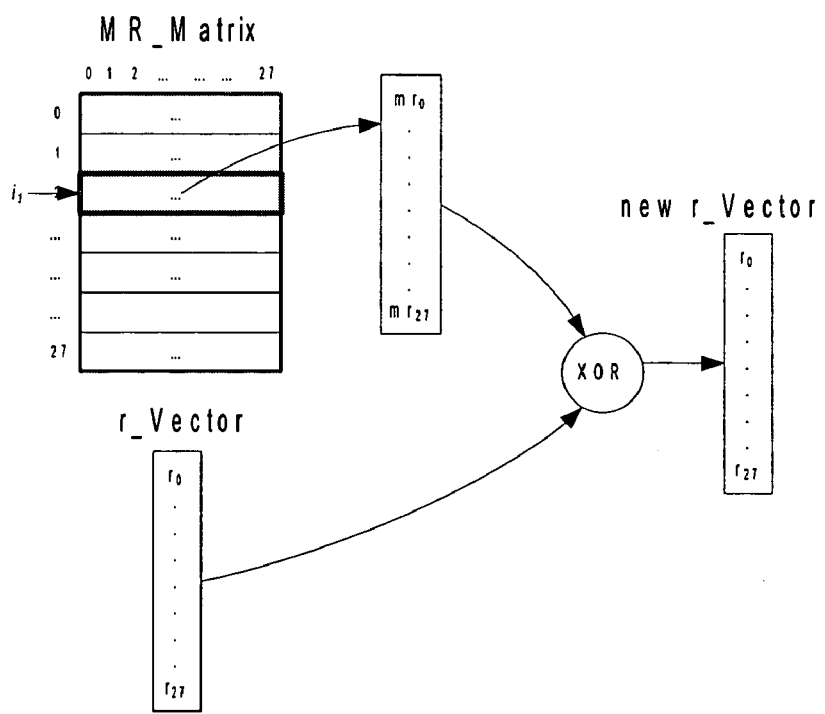

Letting d=HammingWeight(e_Vector_Flip)+1, where d is the new count of different bits. If d<$d_{min}$, then let $d_{min}$=d, and $i_1$=index of the corresponding column in P_Matrix. This process continues until all columns in P_Matrix have been processed. If $d_{min}$=1, the process is stopped, as the error bit has been located. As discussed in detail above, $[r^{(1)}]^t=[r^{(0)}]^t+E_J[M^{(0)}]^{-1}$, where J=1. Therefore, the new r_Vector is calculated by performing the XOR operation on the $i_1$-th row of MR_Matrix and the original r_Vector (the one from Gaussian elimination), as shown in FIG. 12.

Figure 13:
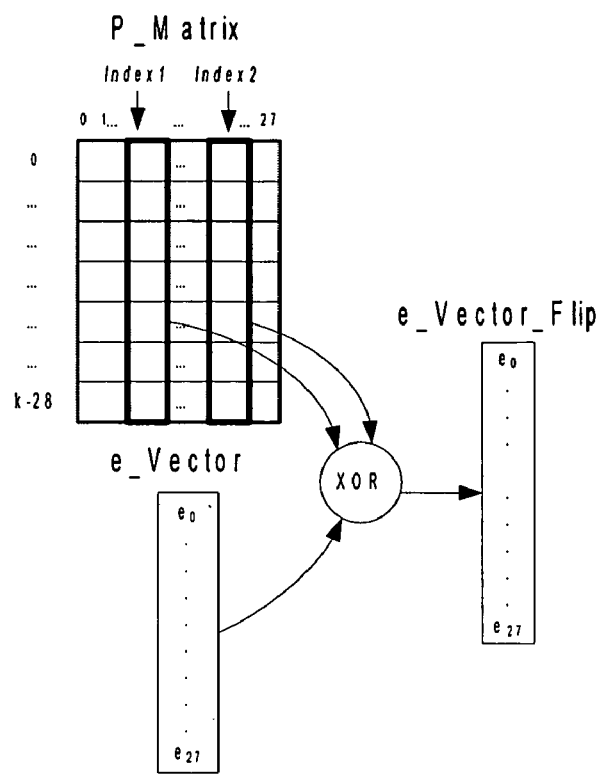

If $d_{min} \neq 1$, it means that there are more than 1 error bits. Accordingly, two of the n selected bits are flipped to determine if a smaller d can be obtained. For every pair of columns of P_Matrix, the two columns are obtained and the XOR operation is performed with e_Vector. As shown in FIG. 13, the result is e_Vector_Flip. Letting d=HammingWeight (e_Vector_Flip)+2, d is the new count of different bits. If d<$d_{min}$, then $d_{min}$=d, and $i_1$=index of the first corresponding column, and $i_2$=index of the second corresponding column in P_Matrix. This process continues for all pairs of columns in P_Matrix.

Figure 14:
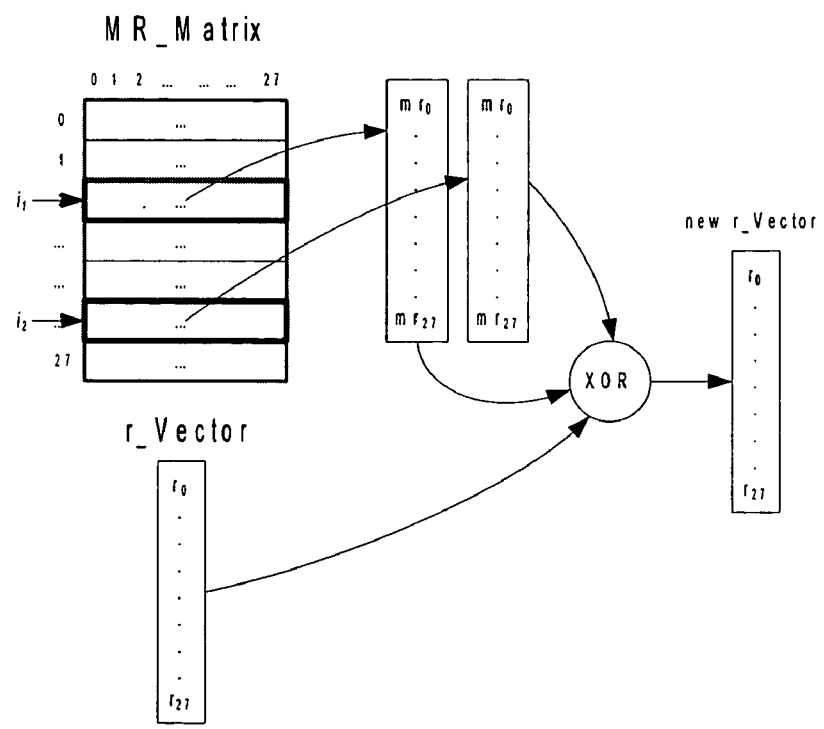

If $d_{min}$=2, then the process is stopped, as it indicates that the two error bits have been identified. As discussed above, $[r^{(1)}]^t=[r^{(0)}]^t+E_J[M^{(0)}]^{-1}$, where J=2. Therefore, the new r_Vector is calculated by performing the XOR operation on the $i_1$-th and $i_2$-th row of MR_Matrix and the original r_Vector (the one from Gaussian elimination). As shown in FIG. 14, the new r_Vector is output as the solution of r. If $d_{min} \neq 2$, the process continues to the next step.

Thus, if $d_{min}$ is the d obtained with no bit flipping, the original r_Vector (the one from Gaussian elimination) is output as the solution to r. If $d_{min}$ is the d obtained with one bit flipping, the new r_Vector is calculated by performing the XOR operation on the $i_1$-th row of MR_Matrix and the original r_Vector. The new r_Vector is output as the solution to r. If $d_{min}$ is the d obtained with two bit flipping, the new r_Vector by is calculated by performing the XOR operating with the $i_1$-th and $i_2$-th row of MR_Matrix and the original r_Vector. The new r_Vector is output as the solution to r. Thuse, the output of the stochastic decoding process is the location vector r.

Calculation of L by Discrete Logarithm

Given location vector r, the discrete logarithm determination module 709 can obtain L (referred to as the bit "s" above in paragraphs 42 and 43) by a discrete logarithm determination technique. L is the location of the first element in the Extracted_Bits_Array of the m-sequence, and $L \in \{0, 1, \ldots, 2^n-2\}$, where n is the order of the m-sequence. r can be viewed as an element of the finite field $F_{2^n}$. It can be proven that:

$$r = \alpha^L$$

where $\alpha$ is a primitive element of the finite field $F_{2^n}$ and is known from the division of polynomials that generates the m-sequence. Therefore, given r, L can be solved from the above equation.

Letting n be the order of the m-sequence, m be the period of the m-sequence, i.e. $m = 2^n 1$, $m_i$ be the prime factors of $m = 2^n - 1$, and w be the number of $m_i$'s. For each $m_i$, $v_i$ is chosen such that $$\mod\left(\frac{m}{m_i} \cdot v_i, m_i\right) \equiv 1,$$

where $i = 1, \ldots, w$.

In the illustrated implementation, n=28, so $\alpha = (1,0,0,1,0,0,0,0,0,0,0,0,0,0,0,0,0,0,0,0,0,0,0,0,0,0,0,0,1)^t$ (correspondingly, the primitive polynomial in division $$\frac{1}{P_n(x)}$$

that generates the m-sequence is $P_n(x) = 1 + x^3 + x^{28}$), $m = 2^{28} - 1$. There are 6 prime factors of m, i.e., w=6, and the prime factors are: 3, 43, 127, 5, 29, 113. Correspondingly, $v_i$ are: 2, 25, 32, 1, 1, 30. All these are stored in constant tables.

For each $m_i$, $q \in \{0, 1, 2, \ldots m_i-1\}$ is found such that $$\left(\alpha^{\frac{m}{m_i}}\right)^q = r^{\frac{m}{m_i}}.$$

Note that again, these are multiplications over the finite field $F_{2^n}$. Letting $p_i = q$, then, $$L = \mod\left(\sum_{i=1}^{w}\left(p_i \cdot \frac{m}{m_i} \cdot v_i\right), m\right)$$

Localization in the M-Array

Based on the method used in generating the m-array from the m-sequence, the position of the first element in Extracted_Bits_Array in m-array can be obtained:

$$x = \mod(L, m_1)$$

$$y = \mod(L, m_2)$$

where $m_1$ is the width of the m-array, and $m_2$ is the height of the m-array. When the order of the m-sequence is n, $$m_1 = 2^{\frac{n}{2}} + 1,$$

and $$m_2 = 2^{\frac{n}{2}} - 1.$$

For each dimension, the decoding process described above outputs position (x,y). Letting $(x_p, y_p)$ be the output of the dimension representing the X, Y position in Cartesian coordinates, as illustrated above, $(x_p, y_p)$ are the coordinates of point $C_{X,Y}$ in the symbol pattern array.

Solving Multiple Dimensions of m-Arrays Simultaneously

As discussed in detail above, a document may have multiple (e.g., 8) dimensions of m-arrays. Supposing that the dimensions are $b_i$, $i=1, 2, \ldots, C$, and the metadata are encoded by the relative shift $d_j$ between $b_j$ and $b_1$, where $b_1$ is the position dimension and $j=2, 3, \ldots, C$. The metadata are the same no matter where the image is obtained. Therefore, the metadata can be extracted sometime before the error-correcting decoding starts. When $d_j$, $j=2, 3, \ldots, C$, are known, $b_i$, $i=1, 2, \ldots, C$, can be jointly used for the decoding of position. The process is as follows.

Supposing $b_i^t = [r_{b_i}]^t M_{b_i}$, $i=1, 2, \ldots, C$, then the relationship between $r_{b_j}$ and $r_{b_1}$ is $[r_{b_j}]^t = [r_{b_1}]^t Q_{-d_j}$, where $Q_{-d_j} = \hat{M}_{0 \sim (n-1)} A_{d_j} [\hat{M}_{0 \sim (n-1)}]^{-1}$, $\hat{M}_{0 \sim (n-1)}$ are the sub-matrices of $\hat{M}$, consisting of the first n columns of $\hat{M}$, and $A_{d_j} = (a_{d_j} a_{d_j+1} \ldots a_{d_j+n-1})$, where $a_{d_j+k}$ is the coefficients when $\alpha^{d_j+k}$ is expressed as the linear combination of $1, \alpha, \ldots, \alpha^{n-1}$ where $\alpha$ is a primitive element of $F_{2^n}$ and the root of $x^n P_n(x^{-1})$. Therefore the location of vector $r_{b_1}$ may be solved via:

$$(b_1^t b_2^t \ldots b_C^t) = [r_{b_1}]^t (M_{b_1} M_{b_2} \ldots M_{b_C}),$$

The procedure to solve this equation is exactly the same as solving $b_i^t = [r_{b_i}]^t M_{b_i}$, $i=1, 2, \ldots, C$, separately. However, solving them jointly is more efficient in two ways. First, the speed can be nearly C times faster because only one linear system is solved instead (but with some overhead to compute $Q_{-d_j}$ and more XOR operations to solve a larger system). Second, the probability of obtaining the correct solution is also greatly increased, especially when none of the dimensions has enough bits for computing the solution.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:

1. A method, preformed by a computer having a memory and a processor, of determining a position of a bit s in a pattern formed from a binary sequence array m of order n, comprising:

capturing an image of a portion of the pattern such that the captured image includes at least n bits b of the array m;

with a processor, solving for r where b=rM, $$\hat{M} = \begin{pmatrix} m^t \\ \sigma(m^t) \\ \vdots \\ \sigma^{n-1}(m^t) \end{pmatrix},$$

$\sigma^x(m^t)$ is the $x^{th}$ cyclic shift of $m^t$, and M is a subset of $\hat{M}$ by:
- (a) randomly selecting n bits $b^{(0)}$ from the set of bits b so as to leave remaining bits $\overline{b}^{(0)}$,
- (b) determining a number of different bits $d^{(0)}$ where $d^{(0)}$ is the number of different bits between $([b^{(0)}]^t, [\overline{b}^{(0)}]^t)$ and $[r^{(0)}]^t(M^{(0)}, \overline{M}^{(0)})$,
- (c) if the number of different bits $d^{(0)}$ is not zero, changing J bits of the n bits $b^{(0)}$ with J bits of $\overline{b}^{(0)}$ to obtain n bits $b^{(1)}$ from the set of bits b so as to leave remaining bits $\overline{b}^{(1)}$ and bits $b^{(1)}$ are different from bits $b^{(0)}$,
- (d) updating r according to the following formula:

$$[r^{(1)}]^t = [r^{(0)}]^t + [e^{(0)}]^t E_{l-n} [P_{R_j}^{(0)}]^{-1} E_k^t [M^{(0)}]^{-1},$$

- (e) determining a number of different bits $d^{(1)}$ where $d^{(1)} = \text{HammingWeight}([e^{(0)}]^t + E_j P^{(0)}) + J$,
- (f) repeating (a)~(d) an estimated number of times in order to ensure a high probability of successful decoding, and
- (g) outputting r that corresponds to the smallest value of d; and with a processor, employing a discrete logarithm technique to obtain the location of s in r.

2. The method recited in claim 1, further comprising: obtaining bits $b^{(1)}$ from bits $b^{(0)}$ by flipping J bits in $b^{(0)}$ by:
- (h) randomly selecting n bits $b^{(0)}$ from the set of bits b so as to leave remaining bits $\overline{b}^{(0)}$,
- (i) determining a number of different bits $d^{(0)}$ where $d^{(0)}$ is the number of different bits between $([b^{(0)}]^t, [\overline{b}^{(0)}]^t)$ and $[r^{(0)}]^t(M^{(0)}, \overline{M}^{(0)})$,
- (j) if the number of different bits $d^{(0)}$ is not zero, flipping J bits of the n bits $b^{(0)}$ to obtain n bits $b^{(1)}$,
- (k) updating r according to the following formula:

$$[r^{(1)}]^t = [r^{(0)}]^t E_J [M^{(0)}]^{-1},$$

- (l) determining a number of different bits $d^{(1)}$ where $d^{(1)} = \text{HammingWeight}([e^{(0)}]^{t+E_j} P^{(0)}) + J$,
- (m) repeating (h)~(k) for some estimated times in order to ensure a high probability of successful decoding, and
- (n) outputting r that corresponds to the smallest value of d; and employing a discrete logarithm technique to obtain the location of s in r.

3. The method of claim 1, where the n bits of $b^{(0)}$ are selected by Gaussian elimination.

4. The method of claim 1, wherein the position of the bit s in the array corresponds to a geometric position of the bit s on a writing media.

5. The method of claim 1, further comprising:
determining a position of bits s in an array having a first dimension and a second dimension; and
determining a cyclical shift between the bits s so as to identify the cyclical shift between the first dimension and the second dimension.

6. The method of claim 1, further comprising:
solving multiple-dimension arrays simultaneously.

7. A computer-readable storage medium containing instructions that, when executed by a computer having a memory and a processor, cause the computer to perform a method for determining a position of a bit s in a pattern formed from a binary sequence array m of order n, the method comprising:
capturing an image of a portion of the pattern, the image including bits b of the array m;
solving for r where b = rM, $$\hat{M} = \begin{pmatrix} m^t \\ \sigma(m^t) \\ \vdots \\ \sigma^{n-1}(m^t) \end{pmatrix},$$

$\sigma^x(m^t)$ is the $x^{th}$ cyclic shift of $m^t$, and M is a subset of $\overline{M}$, at least in part by:
- (a) randomly selecting bits $b^{(0)}$ from the set of bits b so as to leave remaining bits $\overline{b}^{(0)}$,
- (b) determining a number of different bits, $d^{(0)}$, $([b^{(0)}]^t, [\overline{b}^{(0)}]^t)$ and $[r^{(0)}]^t(M^{(0)}, \overline{M}^{(0)})$,
- (c) if the number of different bits $d^{(0)}$ is not zero, changing J bits of $b^{(0)}$ with J bits of $\overline{b}^{(0)}$ to obtain $b^{(1)}$, wherein bits $b^{(1)}$ are different from bits $b^{(0)}$,
- (d) updating r according to the following formula:

$$[r^{(1)}]^t = [r^{(0)}]^t [e^{(0)}]^t E_{l-n} [P_{R_j}^{(0)}]^{-1} E_k^t [M^{(0)}]^{-1},$$

- (e) determining a number of different bits $d^{(1)}$, where $d^{(1)} = \text{HammingWeight}([e^{(0)}]^t + E_j P^{(0)}) + J$, and
- (f) outputting r corresponding to the smallest value of d; and employing a discrete logarithm technique to obtain the location of s in the output r.

8. The computer-readable storage medium of claim 7, the method further comprising:
obtaining bits $b^{(1)}$ from bits $b^{(0)}$ by flipping J bits in $b^{(1)}$ by:
randomly selecting bits $b^{(1)}$ from b so as to leave remaining bits $\overline{b}^{(0)}$,
determining a number of different bits, $d^{(0)}$, between, $([b^{(0)}]^t, [\overline{b}^{(0)}]^t)$ and $[r^{(0)}]^t(M^{(0)}, \overline{M}^{(0)})$,
if the number of different bits $d^{(0)}$ is not zero, flipping J bits of $b^{(0)}$ to obtain bits $b^{(1)}$,
updating r according to the following formula:

$$[r^{(1)}]^t = [r^{(0)}]^t E_J [M^{(0)}]^{-1},$$

determining a number of different bits $d^{(1)}$ where $d^{(1)} = \text{HammingWeight}([e^{(0)}]^t + E_j P^{(0)}) + J$, and
outputting r corresponding to the smallest value of d.

9. The computer-readable storage medium of claim 7 wherein the randomly selected bits $b^{(0)}$ are selected from b by Gaussian elimination.

10. The computer-readable storage medium of claim 7 wherein the position of the bit s in the array corresponds to a geometric position of the bit s on a writing media.

11. The computer-readable storage medium of claim 7, the method further comprising:
determining a position of bits s in an array having a first dimension and a second dimension; and
determining a cyclical shift between the bits s so as to identify the cyclical shift between the first dimension and the second dimension.

12. The computer-readable storage medium of claim 7, the method further comprising:
solving multiple-dimension arrays simultaneously.

13. The computer-readable storage medium of claim 7, wherein solving for r further comprises:
repeating (a)~(d) to increase a probability of successful decoding.

14. A computing device having a memory and a processor for determining a position of a bit s in a pattern formed from a binary sequence array m of order n, comprising:
- a component that captures an image of a portion of the pattern, the captured image including bits b of the array m ; and
- a component that, with a processor, solves for r where b=rM, $$\hat{M} = \begin{pmatrix} m^t \\ \sigma(m^t) \\ \vdots \\ \sigma^{n-1}(m^t) \end{pmatrix},$$

$\sigma^x(m^t)$ is the $x^{th}$ cyclic shift of $m^t$, and M is a subset of $\hat{M}$ by:
- selecting bits $b^{(0)}$ from bits b leaving bits $\overline{b}^{(0)}$,
- determining a number of different bits, $d^{(0)}$, between $([b^{(0)}]^t,[\overline{b}^{(0)}]^t)$ and $[r^{(0)}]^t(M^{(0)},\overline{M}^{(0)})$,
- updating r according to the following formula:

$$[r^{(1)}]^t = [r^{(0)}]^t [e^{(0)}]^t E_{l-n} [P_{R_J}^{(0)}]^{-1} E_k^t [M^{(0)}]^{-1},$$

- determining a number of different bits $d^{(1)}$ where $d^{(1)}$=HammingWeight($[e^{(0)}]^t+E_J P^{(0)}$)+J, and
- outputting r that corresponds to the smallest value of d.

15. The computing device of claim 14, further comprising: a component that obtains bits $b^{(1)}$ from bits $b^{(0)}$ by flipping J bits in $b^{(0)}$ by:
- randomly selecting bits $b^{(0)}$ from the set of bits b so as to leaving bits $\overline{b}^{(0)}$,
- determining a number of different bits, $d^{(0)}$, between $([b^{(0)}]^t,[\overline{b}^{(0)}]^t)$ and $[r^{(0)}]^t([M^{(0)},\overline{M}^{(0)}])$,
- if $d^{(0)}$ is not zero, flipping J bits of bits $b^{(0)}$ to obtain bits $b^{(1)}$, updating r according to the following formula:

$$[r^{(1)}]^t = [r^{(0)}]^t = E_j [M^{(0)}]^{-1},$$

- determining a number of different bits $d^{(1)}$ where $d^{(1)}$=HammingWeight($[e^{(0)}]^t+E_J P^{(0)}$)+J, and
- outputting r corresponding to the smallest value of d.

16. The computing device of claim 14 wherein bits $b^{(1)}$ are selected by Gaussian elimination.

17. The computing device of claim 16 wherein the position of the bit s in the array corresponds to a geometric position of the bit s on a writing media.

18. The computing device of claim 17, further comprising:
- a component that determines a position of bits s in an array having a first dimension and a second dimension; and
- a component that determines a cyclical shift between the bits s so as to identify the cyclical shift between the first dimension and the second dimension.

19. The computing device of claim 18, further comprising:
- a component that solves multiple-dimension arrays simultaneously.

20. The computing device of claim 19, further comprising:
- a component that employs a discrete logarithm technique to obtain the location of s in the output r.

* * * * *